(12) United States Patent
Hsu et al.

(10) Patent No.: US 8,945,998 B2
(45) Date of Patent: Feb. 3, 2015

(54) PROGRAMMABLE SEMICONDUCTOR INTERPOSER FOR ELECTRONIC PACKAGE AND METHOD OF FORMING

(71) Applicant: Taiwan Semiconductor Manufacturing Company, Ltd., Hsin-Chu (TW)

(72) Inventors: Chao-Shun Hsu, San Shin (TW); Clinton Chao, Redwood Shores, CA (US); Mark Shane Peng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/932,784

(22) Filed: Jul. 1, 2013

(65) Prior Publication Data
US 2013/0295727 A1 Nov. 7, 2013

Related U.S. Application Data

(63) Continuation of application No. 11/807,505, filed on May 29, 2007, now Pat. No. 8,476,735.

(51) Int. Cl.
*H01L 21/82* (2006.01)
*H01L 21/768* (2006.01)
(Continued)

(52) U.S. Cl.
CPC .... *H01L 21/76886* (2013.01); *H01L 23/49827* (2013.01); *H01L 23/5382* (2013.01);
(Continued)

(58) Field of Classification Search
CPC ........... H01L 2023/4087; H01L 2224/97; H01L 2225/107; H01L 2225/01041; H01L 24/97; H01L 23/4012; H01L 25/043; H01L 25/0657; H01L 21/76886; H01L 23/49827; H01L 23/5382; H01L 23/642; H01L 23/645; H01L 23/147; H01L 2224/16; H01L 2924/01078; H01L 2924/10253; H01L 2924/15174; H01L 2924/15311; H01L 2924/19011; H01L 2924/15192
USPC ........... 257/67, 686, 678, 774, 777, 778, 257/E25.006, E25.013, E25.018, E25.021, 257/E25.027, E23.085, E23.169, E23.178, 257/E21.541, E23.086, E21.611; 438/106–110, 128–132
See application file for complete search history.

(56) References Cited

U.S. PATENT DOCUMENTS 4,349,862 A * 9/1982 Bajorek et al. ............. 361/762
5,257,224 A 10/1993 Nojiri et al.
(Continued)

*Primary Examiner* — Galina Yushina
(74) *Attorney, Agent, or Firm* — Slater & Matsil, L.L.P.

(57) ABSTRACT

Various structures of a programmable semiconductor interposer for electronic packaging are described. An array of semiconductor devices having various values is formed in the interposer. A user can program the interposer and form a "virtual" device having a desired value by selectively connecting various one of the array of devices to contact pads formed on the surface of the interposer. An inventive electronic package structure includes a standard interposer having an array of unconnected devices of various values and a device selection unit, which selectively connects various one of the array of devices in the standard interposer to an integrated circuit die encapsulated in the electronic package. Methods of forming the programmable semiconductor interposer and the electronic package are also illustrated.

21 Claims, 21 Drawing Sheets

(51) Int. Cl.
H01L 23/498 (2006.01)
H01L 23/538 (2006.01)
H01L 23/64 (2006.01)
H01L 21/00 (2006.01)
H01L 23/14 (2006.01)

(52) U.S. Cl.
CPC ............ H01L23/642 (2013.01); H01L 23/645 (2013.01); *H01L 23/147* (2013.01); *H01L 2224/16* (2013.01); *H01L 2924/01078* (2013.01); *H01L 2924/10253* (2013.01); *H01L 2924/15174* (2013.01); *H01L 2924/15311* (2013.01); *H01L 2924/19011* (2013.01); *H01L 2924/15192* (2013.01); *H01L 2924/13091* (2013.01)
USPC ........... 438/128; 438/129; 438/130; 438/110; 438/106; 438/107; 257/686; 257/774; 257/E23.085; 257/E25.006; 257/E25.027

(56) References Cited

U.S. PATENT DOCUMENTS

| | | | |
|---|---|---|---|
| 5,391,917 A | 2/1995 | Gilmour et al. | |
| 5,400,262 A | 3/1995 | Mohsen | |
| 5,468,681 A * | 11/1995 | Pasch ............................ | 438/108 |
| 5,510,298 A | 4/1996 | Redwine | |
| 5,572,409 A | 11/1996 | Nathan et al. | |
| 5,767,001 A | 6/1998 | Bertagnolli et al. | |
| 5,790,466 A | 8/1998 | Hotta | |
| 5,821,624 A | 10/1998 | Pasch | |
| 5,912,507 A | 6/1999 | Dunn et al. | |
| 5,973,391 A | 10/1999 | Bischoff et al. | |
| 5,998,292 A | 12/1999 | Black et al. | |
| 6,028,758 A | 2/2000 | Sharpe-Geisler | |
| 6,160,276 A | 12/2000 | Mohsen | |
| 6,184,060 B1 | 2/2001 | Siniaguine | |
| 6,322,903 B1 | 11/2001 | Siniaguine et al. | |
| 6,407,929 B1 | 6/2002 | Hale et al. | |
| 6,448,168 B1 | 9/2002 | Rao et al. | |
| 6,465,892 B1 | 10/2002 | Suga | |
| 6,472,293 B1 | 10/2002 | Suga | |
| 6,522,595 B2 | 2/2003 | Carson et al. | |
| 6,538,330 B1 | 3/2003 | Forbes | |
| 6,538,333 B2 | 3/2003 | Kong | |
| 6,599,778 B2 | 7/2003 | Pogge et al. | |
| 6,617,681 B1 | 9/2003 | Bohr | |
| 6,639,303 B2 | 10/2003 | Siniaguine | |
| 6,664,129 B2 | 12/2003 | Siniaguine | |
| 6,670,659 B1 | 12/2003 | Gudesen et al. | |
| 6,671,947 B2 | 1/2004 | Bohr | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 6,984,583 B2 | 1/2006 | Farnworth | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,233,061 B1 * | 6/2007 | Conn ........................... | 257/686 |
| 7,262,495 B2 | 8/2007 | Chen et al. | |
| 7,268,419 B2 * | 9/2007 | Cornelius .................... | 257/686 |
| 7,297,574 B2 | 11/2007 | Thomas et al. | |
| 7,335,972 B2 | 2/2008 | Chanchani | |
| 7,355,273 B2 | 4/2008 | Jackson et al. | |
| 2002/0059555 A1 | 5/2002 | Osann, Jr. et al. | |
| 2002/0081838 A1* | 6/2002 | Bohr ............................ | 438/637 |
| 2003/0057544 A1 | 3/2003 | Nathan et al. | |
| 2005/0280146 A1 | 12/2005 | Cornelius | |
| 2006/0012966 A1 | 1/2006 | Chakravorty | |
| 2006/0170435 A1* | 8/2006 | Granicher et al. ........... | 324/754 |
| 2006/0217906 A1* | 9/2006 | Barbara et al. ................. | 702/60 |
| 2008/0143379 A1 | 6/2008 | Norman | |
| 2008/0151515 A1 | 6/2008 | Das et al. | |

* cited by examiner

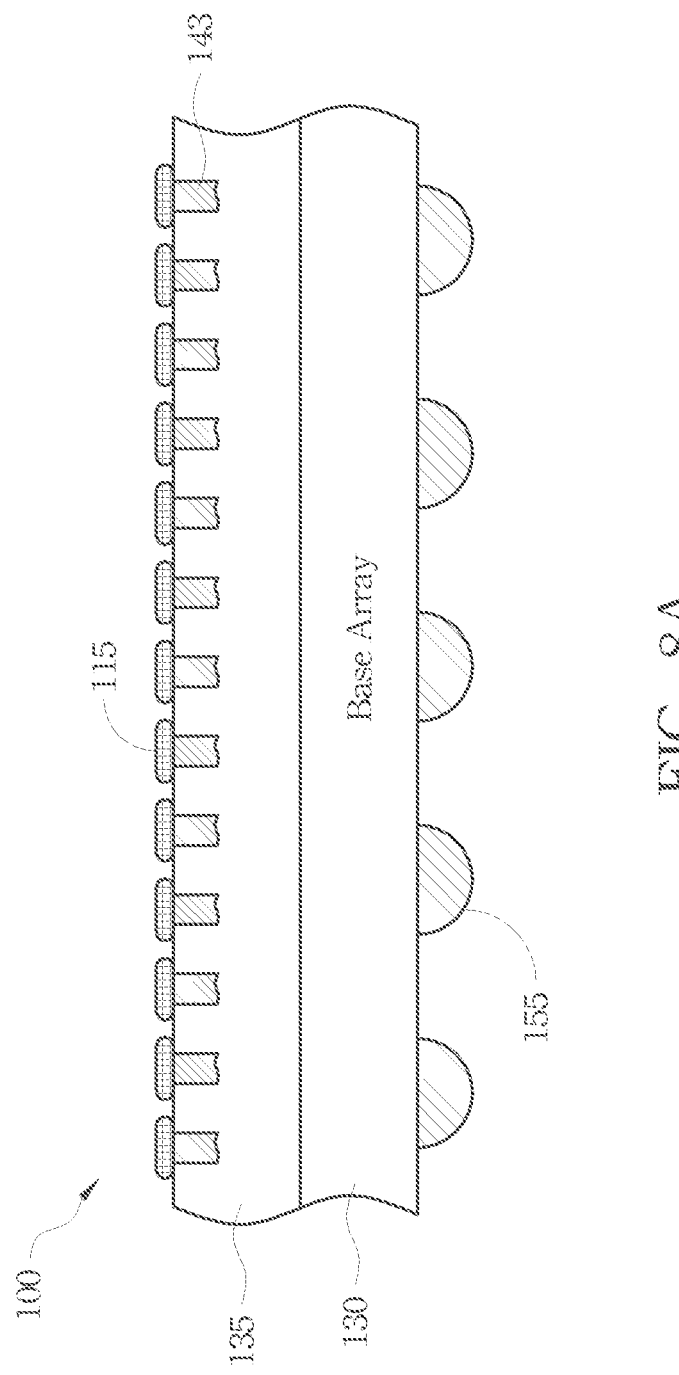

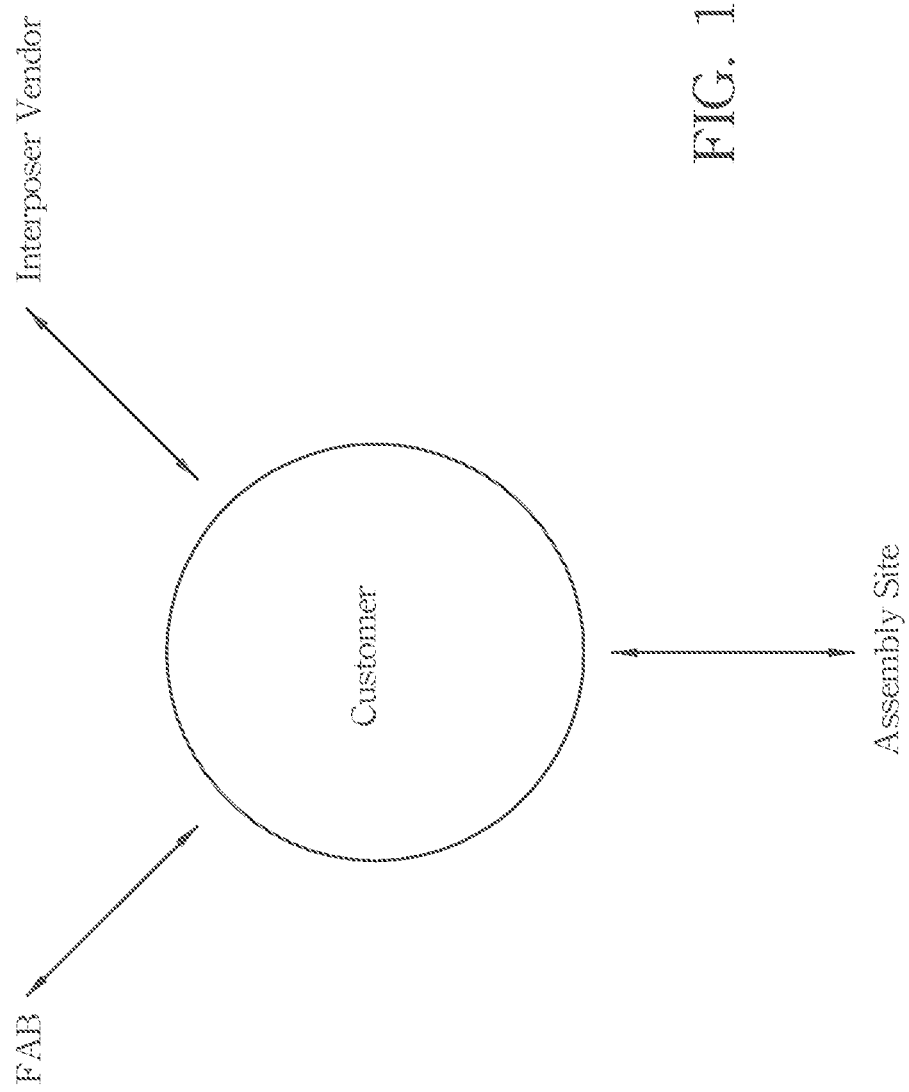

PROGRAMMABLE SEMICONDUCTOR INTERPOSER FOR ELECTRONIC PACKAGE AND METHOD OF FORMING

This application is a continuation of U.S. patent application Ser. No. 11/807,505, filed on May 29, 2007, and entitled "Programmable Semiconductor Interposer for Electronic Package and Method of Forming," which application is incorporated herein by reference.

TECHNICAL FIELD

The present invention relates generally to a semiconductor interposer in an electronic package and method of forming the same, and more particularly to a standard, programmable interposer wherein desired circuit functions can be formed and coupled to an integrated circuit die attached to said interposer.

BACKGROUND

As the trend to provide substantially increased circuit functionality on an integrated circuit die continues, the so-called system-on-chip (SOC) integrated circuit configuration has rapidly gained popularity in almost all application fields of an integrated circuit. It has hence become necessary to form a tremendously large number of transistors on an integrated circuit die. In the meantime, forming a complex electronic system on an integrated circuit die results in the need for a large number of input/output (I/O) connections between an integrated circuit die and the rest of the electronic system of which the integrated circuit is a part. New packaging technologies, such as flip-chip ball grid array (BGA) have been developed to meet this need. In a flip-chip BGA package, a large number of I/O connection terminals (solder balls) are disposed in a two dimensional array over a substantial portion of a major surface of an integrated circuit die. The die surface with solder bump array formed thereon is in turn attached to a supporting package substrate. Although flip-chip BGA packages provide a space-saving solution, other technical challenges remain to be addressed. First, the coefficient of thermal expansion of a package substrate (in general, a dielectric material) does not provide a good match with the semiconductor material of an integrated circuit die. Thermal stress could cause the solder bumps and die to tear free of the package, which casts a major reliability concern on the package of this configuration. Second, for example, as the device feature sizes in the logical part of a system-on-chip integrated circuit continue to shrink, a relatively large portion of die area will be occupied by hard-to-scale circuits such as RF circuits, wherein large value capacitors and inductors are usually required for circuit function. This phenomenon will eventually lead to a point where further scaling down of die size will become extremely difficult, if not impossible. The other issue facing the SOC configuration is the increasing challenge on SOC design, where, for example, integrating digital and RF functions on a same die has made circuit modeling much more complicated and on-chip signal interference difficult to resolve. This and other challenges have lead to the adoption of an interposer in an electronic package, where a structure made of material having a matching coefficient of thermal expansion to a semiconductor die is provided between an integrated circuit die and package substrate. Circuit functions involving large size passive/active devices can also be formed in an interposer and coupled to an integrated circuit die attached to it.

Shown in FIG. 1 is a schematic section view of an integrated circuit die coupled to a prior art silicon interposer and the silicon interposer coupled to a supporting package substrate. In FIG. 1 a silicon-based integrated circuit die 10 is attached to a first side of a silicon interposer 30. Solder bumps 15 are used to provide electrical connection between integrated circuit die 10 and silicon interposer 30. A second side of silicon interposer 30 is attached to package substrate 50 by solder balls 55. Solder balls 55 provides electrical connection between silicon interposer 30 and package substrate 50, which in turn makes electrical connection to a printed circuit board (PCB, not shown) through package leads 65. A silicon interposer provides a matching coefficient of thermal expansion to the integrated circuit die in order to reduce the potential solder failure between the integrated circuit die and the package substrate caused by thermal stresses. A silicon interposer also provides adaptation between smaller contact pads with reduced pitch on an integrated circuit die and larger contact pads with increased pitch on a package substrate. In addition, various circuit elements may be incorporated into a silicon interposer. These circuit elements may be active, passive, or a combination of active and passive elements.

FIG. 2 is a schematic section view of a silicon interposer in accordance with FIG. 1. Silicon interposer 30 includes silicon substrate 33, insulating material 35, solder bumps 15, solder balls 55, interconnections 32, and through-silicon-vias 34. In general, silicon substrate 33 is similar to the doped silicon substrate used to form integrated circuit die 10, wherein active semiconductor devices can be formed. Insulating material 35 can be oxide dielectric or other dielectric materials in which interconnection layers may be formed from a conductive material such as aluminum and copper. Solder bumps 15 having tighter pitch are adapted for connection to integrated circuit die 10, while solder balls 55 having wider pitch are adapted for connection to package substrate 50. Through-silicon-vias 34 provide direct electrically conductive pathways between solder bumps 15 and solder balls 55. It can be seen that passive devices, such as capacitor 41, resistor 42, inductor 43 and active devices, such as MOSFET 44 can be formed in insulating material 35 and/or silicon substrate 33. These devices are electrically connected to the integrated circuit die 10 through solder bumps 15. Active and passive devices integrated in an interposer can provide necessary circuit functions to an integrated circuit die and offer advantageous features which would otherwise not be possible if placing these devices in the integrated circuit die or on the printed circuit board an electronic package attached to. As an example, placing a decoupling capacitor into an integrated circuit die requires dramatic increase on die size, while placing it on a printed circuit board causes undesirable parasitic inductance associated with metal traces and package leads. These and other drawbacks are generally overcome by placing a decoupling capacitor in an interposer closer to an integrated circuit die in a same electronic package.

However, technical drawback remains in a prior art interposer. In designing and manufacturing a prior art interposer, an integrated circuit design (user, customer) must first decide what circuit functions and device parameters are to be expected from an interposer, through system level modeling and prototyping. A package design team is usually dedicated in designing a custom interposer on which active/passive devices of fixed values are formed to match a specific integrated circuit product. Due to this nature, an electronic package involving a prior art interposer is in general very costly to design and manufacture. In practice, only integrated circuit products of large market volume can justify the cost relating to the interposer containing package scheme. This drawback has hindered prior art interposers from quicker and wider adoption in electronic packaging. In view of this and others problems in making and using a prior art interposer, there is a need for a standard, programmable interposer which can be designed and manufactured as a standard product in large scale, which can supply specific circuit function to a custom integrated circuit product, when appropriately programmed.

BRIEF DESCRIPTION OF THE DRAWINGS

For a more complete understanding of the present invention, and the advantages thereof, reference is now made to the following descriptions taken in conjunction with the accompanying drawing, in which:

FIGS. 8A-8C show another embodiment where "programming" a pre-made base array interposer takes place after a silicon interposer is completely formed;

FIG. 11 shows a preferred flow of coordinating packaging activities when using interposers of preferred embodiments of the current invention.

DETAILED DESCRIPTION OF ILLUSTRATIVE EMBODIMENTS

The making and forming of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a standardized, user programmable silicon interposer structure with an array arrangement of passive and/or active devices, and the methods of forming the same. The invention also encompasses the structure and method of forming an electronic package comprising said interposer.

Figure 1:
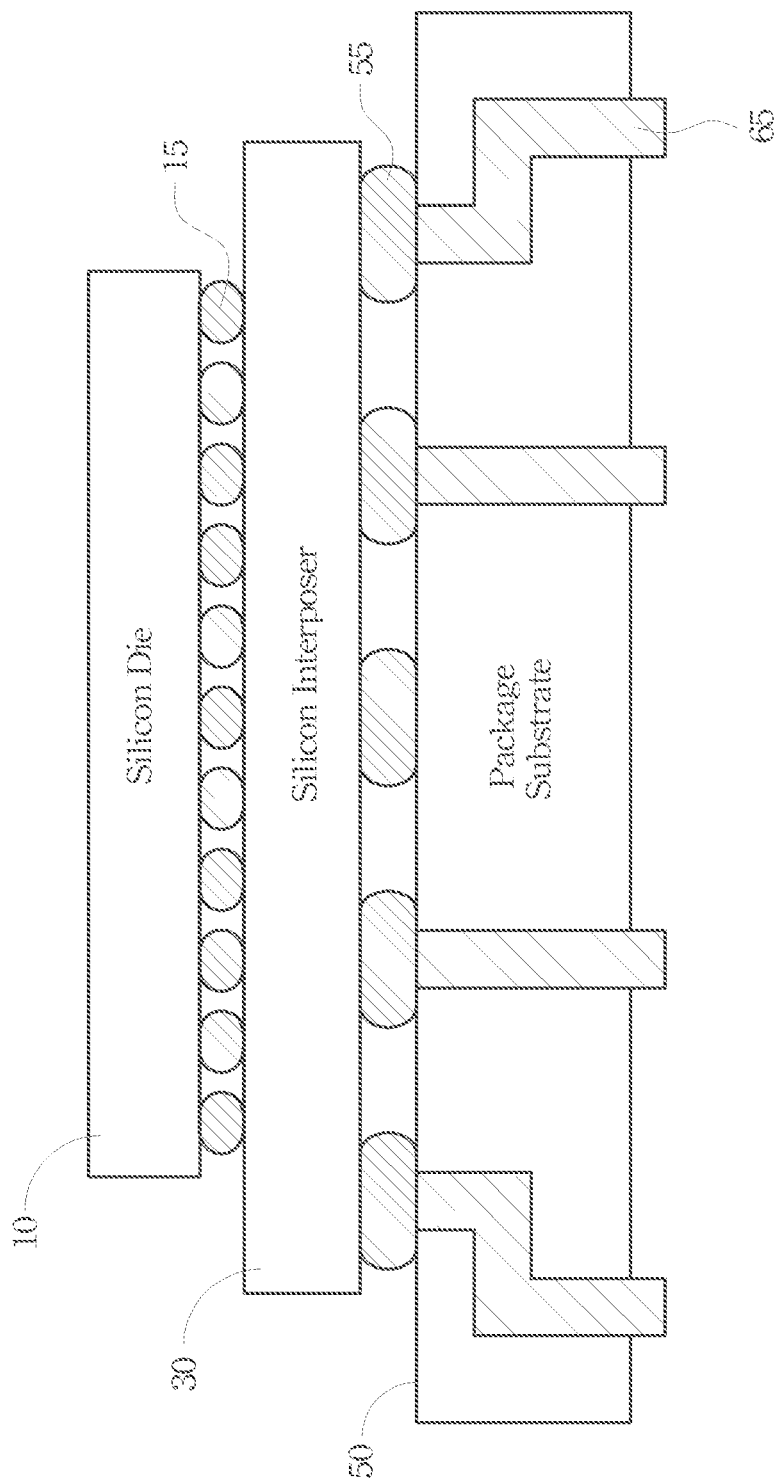
FIG. 1 is a schematic section view of a integrated circuit die coupled to a prior art silicon interposer, and the silicon interposer coupled to a supporting package substrate.
Figure 2:
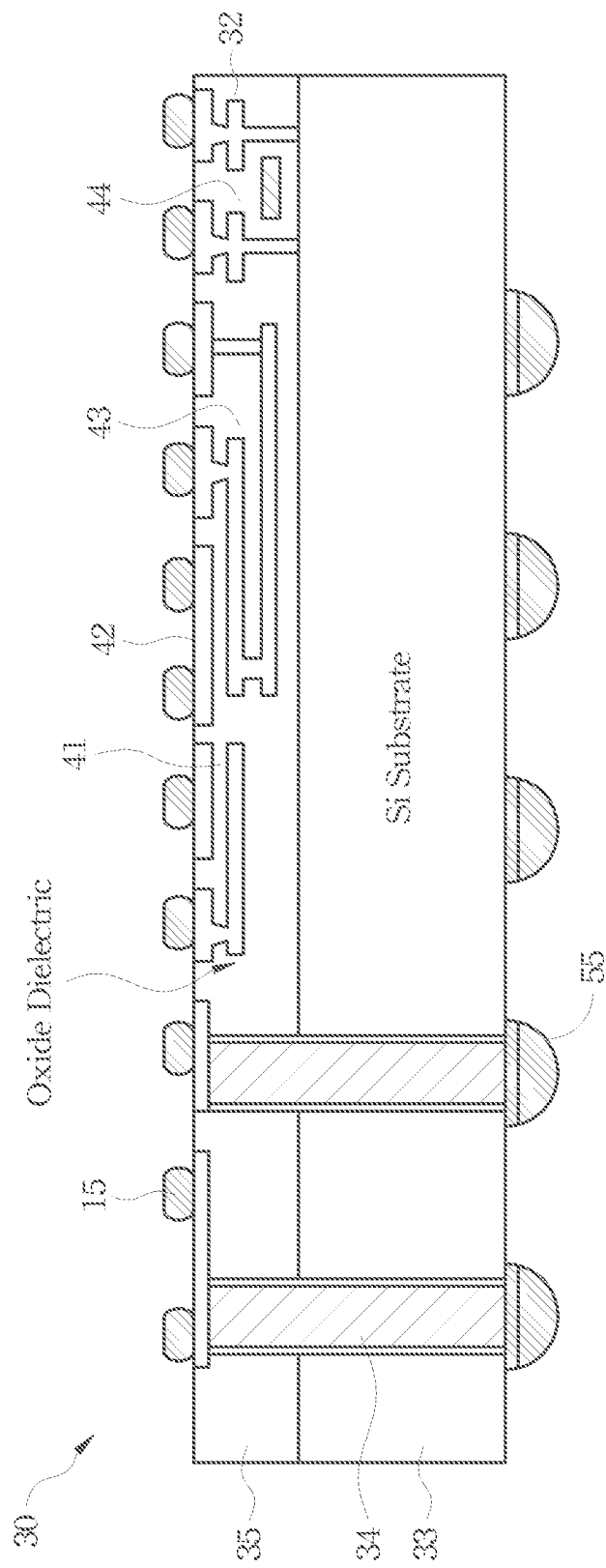
FIG. 2 is a schematic section view of a prior art silicon interposer shown in FIG. 1.
Figure 3:
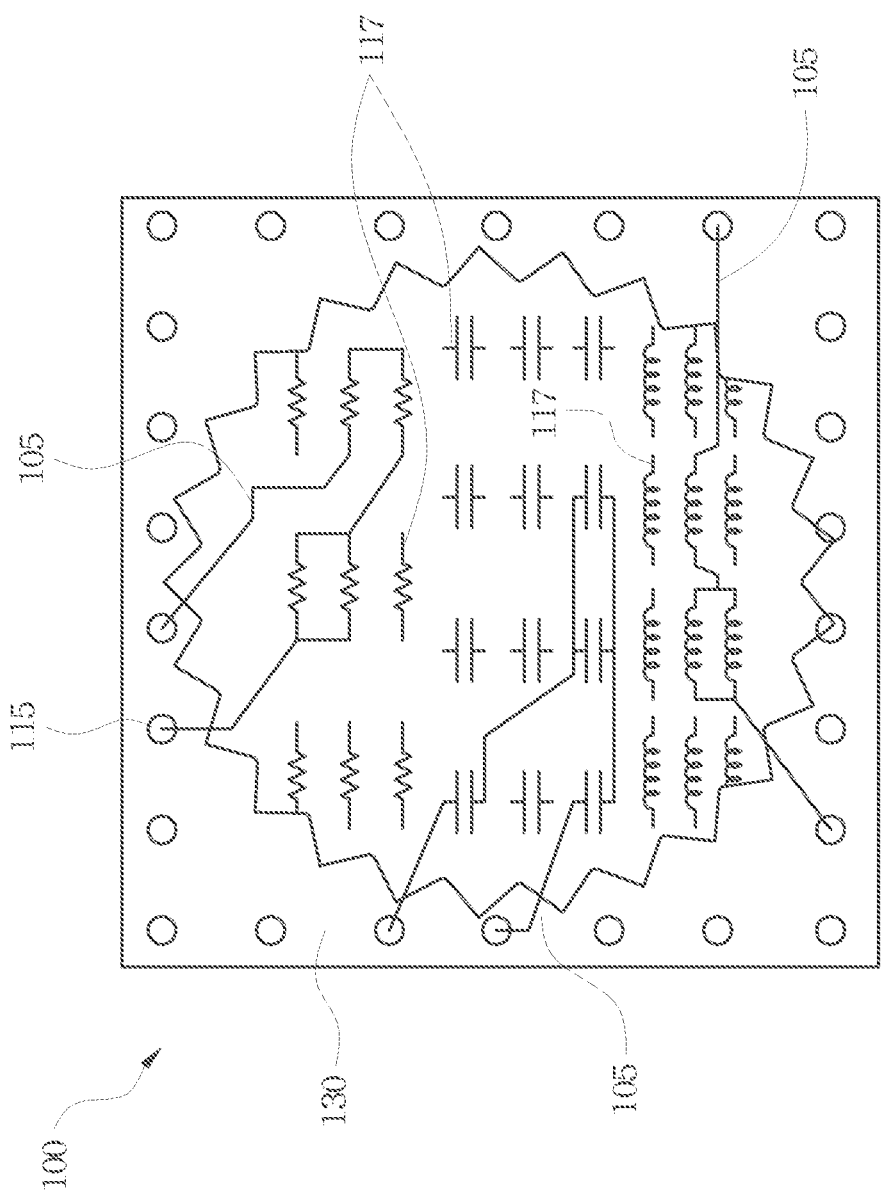
FIG. 3 is a schematic top view of one embodiment in accordance with the current invention.

FIG. 3 is a schematic top view of one embodiment in accordance with the current invention, where the arrangement of passive devices in an interposer 100 is shown. Interposer 100 includes a substrate 130, which is formed from silicon, although other suitable semiconductor materials, such as silicon germanium, gallium arsenide, indium phosphide, among others, and other suitable non-semiconductor interposer substrate materials, such as resin, ceramic, and polymide are not excluded. Interposer 100 may also include at least one electrically insulating material 135 (see FIG. 4) formed atop substrate 130. Active and/or passive devices can be formed in an interposer 100 to couple circuit functions to an integrated circuit die (not shown) electrically connected to the interposer. The electrically insulating material 135 is used to provide a variety of advantageous features in an interposer, such as to prevent shorting of the various devices formed therein, to provide dielectric material of a capacitor, etc. The insulating materials can be formed from a variety of dielectric materials, such as silicon dioxide ($SiO_2$), silicon nitride ($Si_3N_4$), high dielectric constant materials, although other suitable dielectric materials are not excluded.

Also shown in FIG. 3 are conductive structures 115 formed on a top surface of a preferred embodiment of the current interposer. Conductive structures 115 may be balls, bumps, columns, pillars, or other structures formed from a conductive material, such as solder, metal, or metal alloy to facilitate electrical connections to semiconductor devices formed in an integrated circuit die (not shown) attached to the interposer 100. In preferred embodiments, solder bumps are used to make electrical connections to an integrated circuit die.

Enclosed by a zigzagged circle in FIG. 3 is a portion of an underlying surface of an interposer 100 of preferred embodiments, where a preferred arrangement of passive devices is illustrated. It can be seem that arrays of unconnected passive devices are formed in an interposer. The parameters of passive devices 117 in each array are chosen so that, for instance, a desired capacitance value can be obtained by making appropriate serial and/or parallel electrical connections 105 among the pre-formed capacitors in a capacitor array. In other words, by selectively connecting various ones of the devices in the array, a "virtual" device is formed having a desired value. In a similar manner, a desired resistance or inductance value corresponding to an application of an integrated circuit die can be obtained by making proper connections from pre-formed resistors or inductors in an array. Electrical connection to an integrated circuit die can be made through solder bumps 115 on a top surface of interposer 100.

Figure 4:
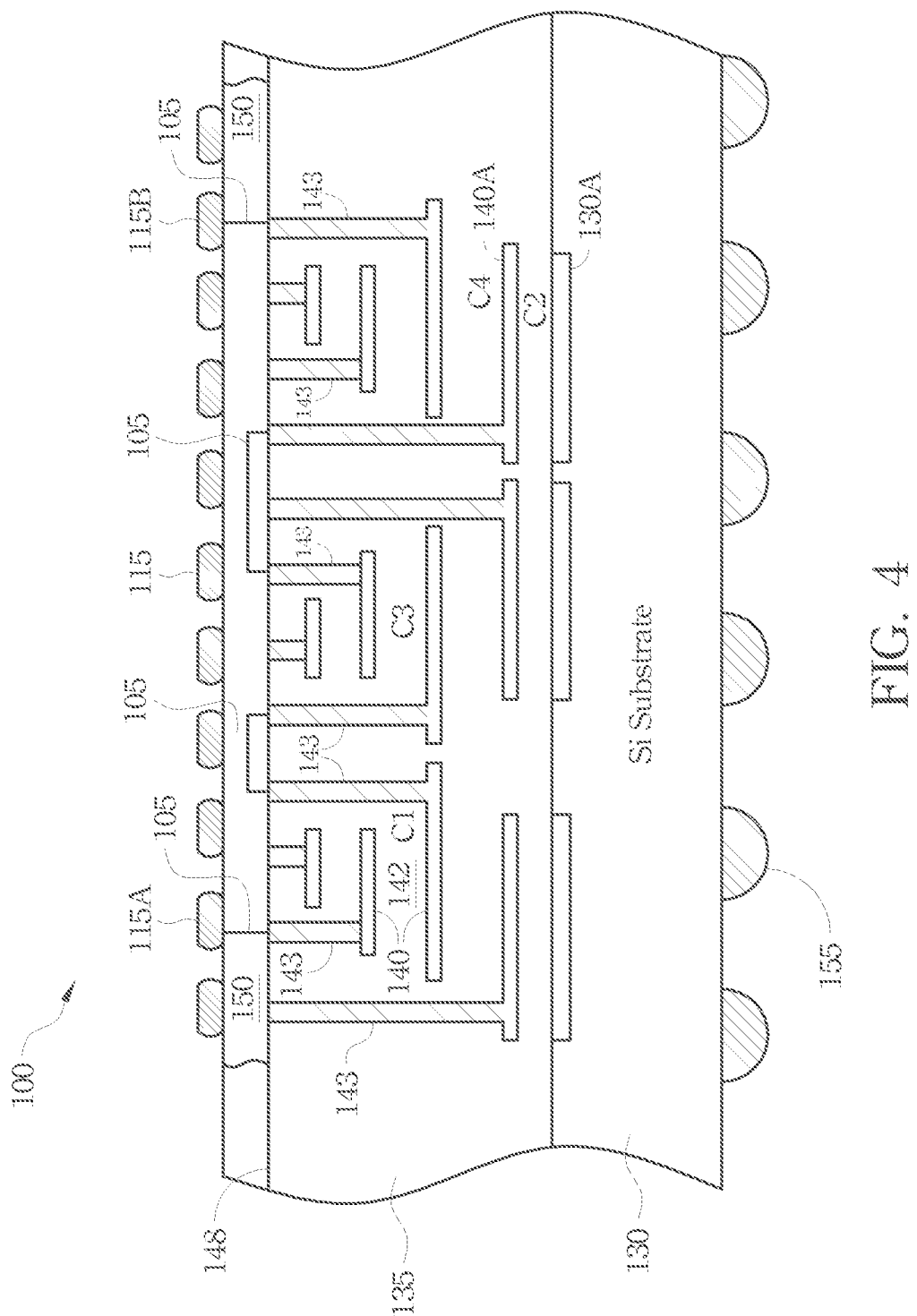
FIG. 4 is a portion of a schematic section view of a silicon interposer in accordance with FIG. 3.

FIG. 4 shows a portion of a schematic section view of silicon interposer 100, wherein an array of patterned capacitors is provided in the insulating material 135 of interposer 100. In this view it can be seem that capacitors in a capacitor array are formed vertically in the insulating material 135, stacking on the surface of the silicon substrate 130. This arrangement offers significant advantage on substrate space utilization, which allows a large quantity of capacitors to be formed on an interposer substrate of limited area. Capacitors formed in such an array may include MIM (metal-insulator-metal) capacitors, PIP (poly-insulator-poly) capacitors, MOS capacitors or other types of capacitors suitable for various applications. Shown in FIG. 4, an MIM capacitor C1 includes a pair of conductive plates 140 and a dielectric layer 142. Each conductive plate 140 is connected to a vertical conductive interconnect 143, which extends up to a surface 148. Surface 148, sometimes referred to herein as an intermediate interface, will be described in greater detail below with reference to FIG. 7. The conductive plates may be formed of a metal such as aluminum (Al), copper (Cu), tungsten (W) or other suitable metal/metal alloy materials. The dielectric layer 142 may be silicon dioxide ($SiO_2$), silicon nitride ($Si_3N_4$), barium strontium titanate (BST), an alumina ($Al_2O_3$)/tantalum pentoxide ($Ta_2O_5$) sandwich or other high dielectric constant material, for example. Interconnects 143 may be formed of the same or different conductive materials as conductive plates 140. In a preferred embodiment, interconnects 143 comprises metal selected from the group consisting of aluminum (Al), copper (Cu), silver (Ag), tungsten (W), and combinations thereof, although other metals/metal alloys are also within the contemplated scope of the invention. PIP capacitors preferable for analog applications, such as C2, are constructed between a patterned first polysilicon layer 130A formed in the substrate 130 and a patterned second polysilicon layer 140A formed in the insulating material 135. A thin oxide layer is formed between the two polysilicon layers to achieve desired capacitance, although other suitable dielectric materials are not excluded. In preferred embodiments of the current invention, the conductive plates of capacitors can be patterned into different sizes, different shapes, with different dielectric materials formed in between in order to create a capacitor array comprising a large variety of unconnected capacitors, wherefrom a desired capacitance value needed for an integrated circuit application can be obtained through proper connections among selected capacitors.

Also shown in FIG. 4 is an example of a device selection unit 150 provided in an interposer 100, which selectively connects conductive interconnect 143, each connected to a device terminal, on surface 148 to form desired circuit function, and provide said function to solder bumps 115 on the top surface of interposer 100. In the example shown in FIG. 4, floating terminals 143 of capacitors C1, C3, and C4 are serially connected by electrical connection 105 in a device selection unit 150 so that a desired capacitance value can be obtained between solder bumps 115A and 115B, and coupled to a needed integrated circuit die (not shown) attached to the interposer 100. It should be understood that the example of device selection unit 150 shown in FIG. 4 is so disclosed to convey the concept that a device selection unit is used in interposer 100 to form a custom device connection and couple said connection to solder bumps 115. Therefore, it should not be construed as being limited to a structure formed in the upper layers of interposer 100 as shown in FIG. 4. Many embodiments of device selection unit 150 have been employed in an interposer 100 of preferred embodiments. Details of alternative embodiments for device selection unit 150 are discussed below in FIGS. 7-10. Solder balls 155 having wider pitch are provided on a second surface of silicon interposer 100 to make electrical connections to a package substrate (not shown), as appreciated by those skilled in the art. In the embodiment corresponding to FIG. 4, arrays of other passive devices, such as resistors, inductors, transmission lines, fuses/antifuses, Micro Electro mechanical systems (MEMS) may be formed in other regions of interposer 100. Desired passive device parameters may be obtained by device selection unit 150 in similar manners.

Figure 5:
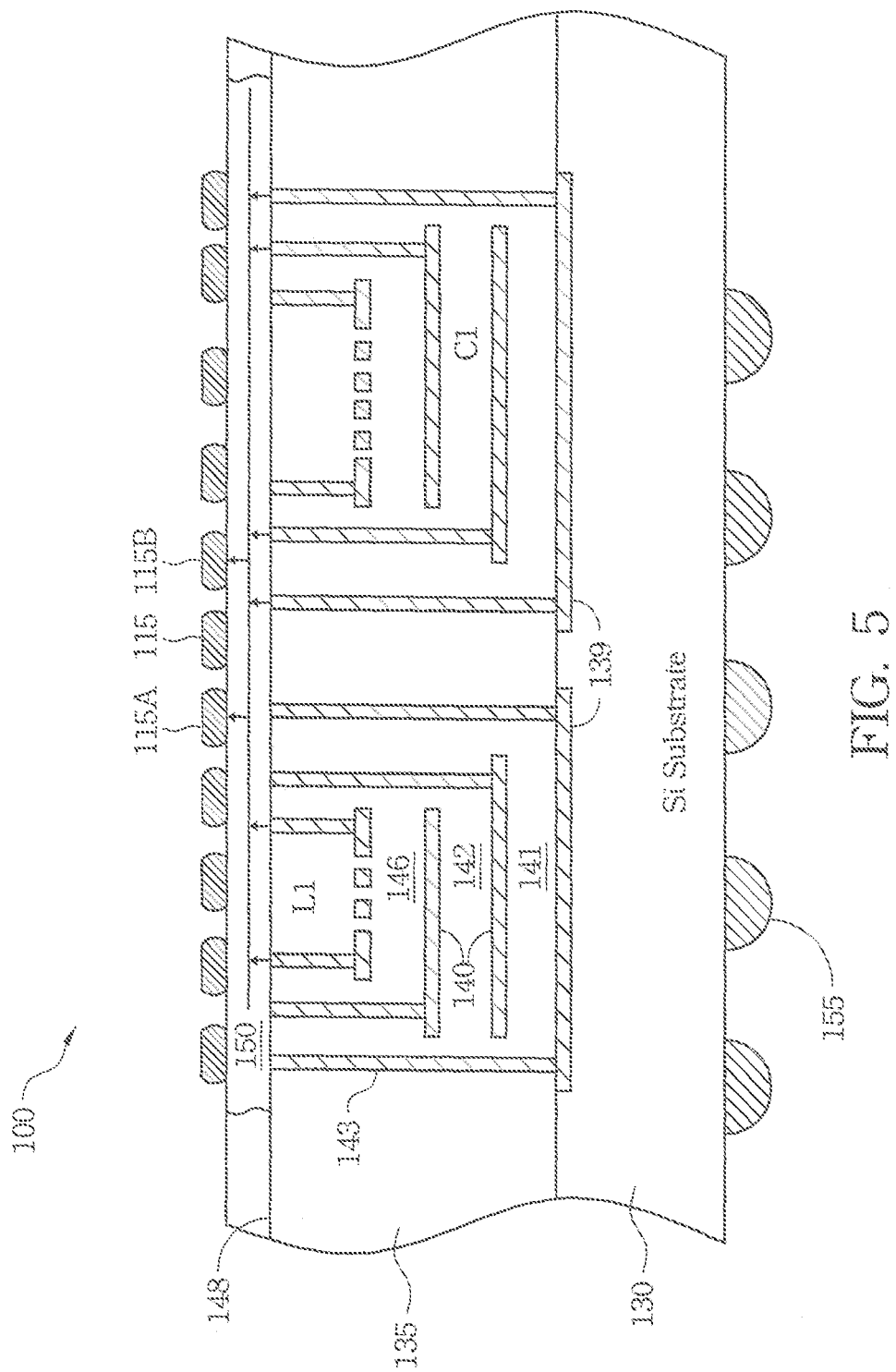
FIG. 5 is a portion of a schematic section view of a silicon interposer in accordance with another embodiment of the current invention.

FIG. 5 shows a portion of schematic section view of silicon interposer 100 in accordance with another embodiment of the current invention. To avoid repetition, like numerals and letters are used for the various elements in FIG. 5 as were used in FIG. 3 and FIG. 4. Also, elements described in FIG. 3 and FIG. 4 may not be described again in detail herein. As can be seem in FIG. 5, a resistor array comprising large variety of resistors 139 may be formed in Si substrate 130 by forming and patterning conductive regions, such as doped silicon regions, undoped polysilicon regions, and silicided polysilicon regions in said Si substrate. The shapes, dimensions and dopant concentrations of patterned regions may vary in order to form resistors with a large variety of resistances. In current embodiment, resistors in rectangular and serpentine shapes are formed, although other resistor shapes are not excluded. An MIM capacitor array is formed atop the resistor array, separated by a first dielectric material 141, such as $SiO_2$, $Si_3N_4$, or other suitable insulating materials. The bottom and top plates 140 of a capacitor can be constructed by forming and patterning a first and a second metal or metal alloy layer in insulating material 135. A second dielectric layer 142, same or different from dielectric material 141, is provided to separate capacitor plates 140. In current embodiment, dielectric layer 142 may be silicon dioxide ($SiO_2$), silicon nitride ($Si_3N_4$), barium strontium titanate (BST), an alumina ($Al_2O_3$)/tantalum pentoxide ($Ta_2O_5$) sandwich, other high dielectric constant materials. Plates 140 can be patterned into any desired shape, although a preferred capacitor has rectangular plates. An inductor array made by a third conductive material is formed atop the capacitor, resistor array stack, separated by a third insulating layer 146 of same or different dielectric material as dielectric layers 141 and 142. In current embodiment, an inductor array comprises a large variety of planar inductors in spiral shape formed by conductive materials such as metals or metal alloys, although other conductive materials and inductor shapes are not excluded.

It can be appreciated by those skilled in the art, by forming inductors in the top conductive layer in an interposer of the current embodiment, a highly accurate inductance value can be coupled to an integrated circuit die (not shown) attached to solder bumps 115, because undesirable parasitic inductances associated with overlying metal traces can be dramatically reduced. Also can be recognized by those skilled in the art, arrays of other passive devices, such as transmission lines, fuses/antifuses, Micro Electro Mechanical Systems (MEMS), and the like, can be formed atop the existing stack in a similar manner. Passive device arrays formed in a stacked manner as in the current embodiment facilitate convenient access, from an integrated circuit die sitting on interposer 100, to a large number of passive devices of various types through solder bumps 115, while parasitic effects associated with conductive traces are reduced to possible minima.

As shown in FIG. 5, terminals of passive devices in an array are connected to vertical interconnects 143, which extend up to surface 148. A device selection unit 150 formed in an interposer 100 of preferred embodiments selectively connects floating terminals of chosen devices and couples desired passive values (capacitance, resistance, inductance, or combination of the same) to an integrated circuit die (not shown) attached to interposer 100 through solder bumps 115. In the example shown in FIG. 5, an RLC network with desired parameters is obtained by device selection unit 150 and coupled, through solder bumps 115A and 115B, to an integrated circuit die (not shown) for its intended application. Again, details of alternative embodiments for device selection unit 150 are discussed below in FIGS. 7-10.

Figure 6:
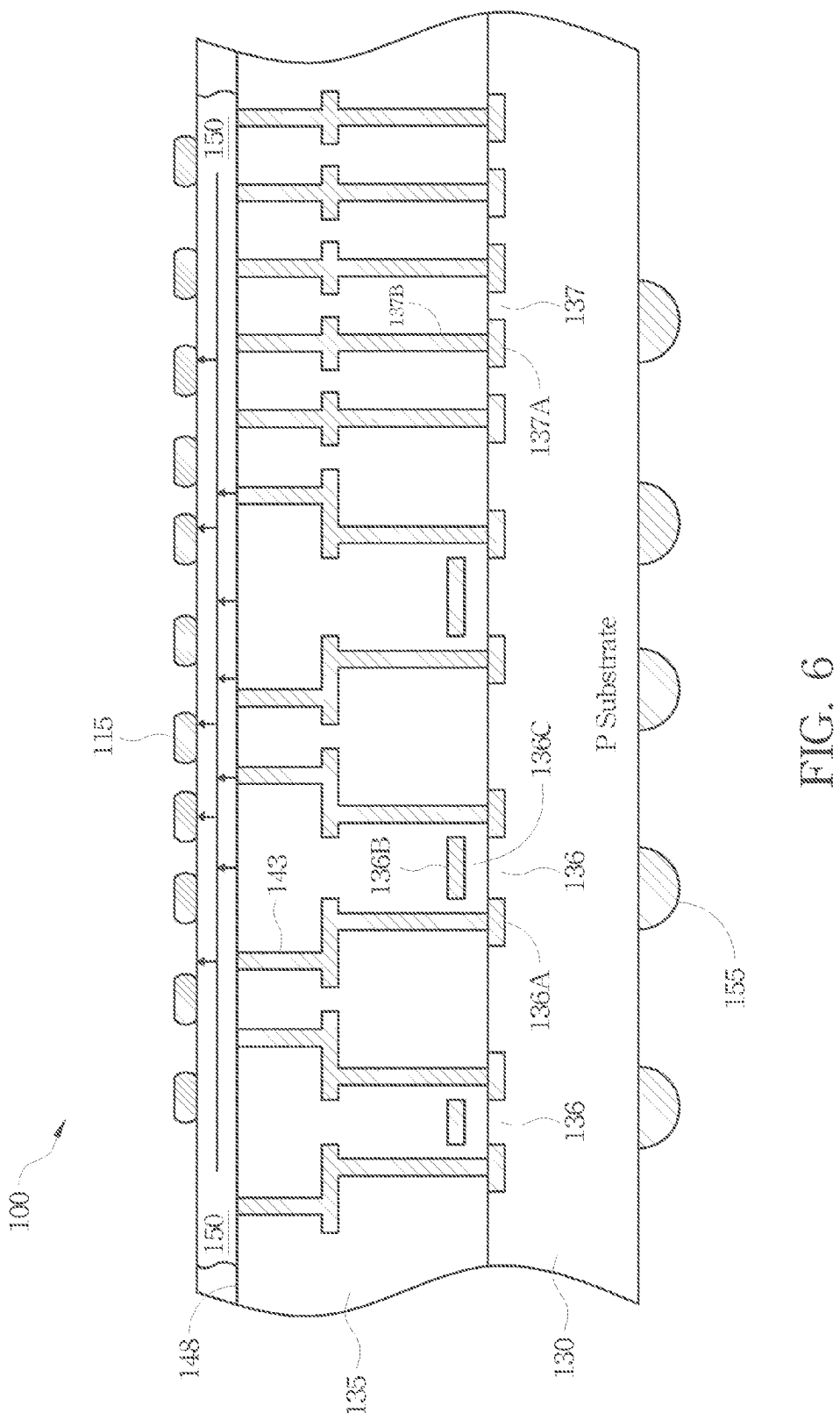
FIG. 6 is another schematic section view of a portion of a silicon interposer in accordance with yet another embodiment of the current invention.

FIG. 6 is another schematic section view of a portion of an interposer in accordance with yet another embodiment of current invention. Again, to avoid repetition, like numerals and letters are used for the various elements in FIG. 6 as were used in FIG. 3, FIG. 4 and FIG. 5. Also, elements described in FIG. 3, FIG. 4 and FIG. 5 may not be described again in detail herein. In an interposer 100 of FIG. 6, in addition to passive device arrays (not shown) formed therein, active device arrays such as MOSFET transistors 136 and diodes 137 are formed in the substrate 130. While the illustrated elements are formed within substrate 130, elements that are formed only partially within or even on the surface of substrate are contemplated herein and generally described as being formed in the substrate. Transistors 136 include source/drain terminals 136A, gate electrodes 136B and gate dielectrics 136C. Transistors 136 may be n-channel or p-channel MOSFET. Diodes 137 include PN junctions 137A and terminals 137B, and are preferably used for temperature sensing and ESD (electrostatic discharge) protection in current embodiment. In an active device array, a large number of active devices of various device parameters are formed to facilitate the formation of a desired circuit function in an interposer of preferred embodiments. Terminals of active devices may be connected to vertical interconnects 143, which extend up to surface 148. A device selection unit 150 formed in an interposer 100 of preferred embodiments selectively connects floating terminals of chosen active and/or passive devices and couples selected devices, through solder bumps 115, to an integrated circuit die (not shown) to fulfill its intended functions. As mentioned above, details of alternative embodiments for device selection unit 150 are discussed below in FIGS. 7-10.

It should be understood by those skilled in the art that the active/passive device arrays illustrated above in preferred embodiments are so disclosed to convey the concept that by integrating various active and passive device arrays into an interposer, a circuit function with desired device parameters can be formed through proper connections through chosen devices. It should not be construed as being limited to the embodiments set forth herein. For example, a BJT (bipolar junction transistors) array can be formed in an interposer to provide analog functions, a memory array can be formed in an interposer to facilitate fast data access from an attached integrated circuit die, and so forth.

Those skilled in the art will also recognize that, by forming a device selection unit 150 in an interposer of preferred embodiments as disclosed above, it is possible to create a general purpose, reconfigurable interposer, which can be manufactured independently, while being able to be "programmed" to form desired circuit functions complementary to an integrated circuit die in order to fulfill a specific application.

Through above disclosures regarding structures of preferred embodiments, those skilled in the semiconductor art can recognize that semiconductor processing techniques used in forming semiconductor integrated circuit dies can be implemented in forming active/passive device arrays in an interposer of preferred embodiments. Film deposition processes, such as spin-on, sputtering, chemical vapor deposition, and electroplating, can be used to form conductive and dielectric layers on an interposer substrate, for example. Doping processes, such as diffusion and implantation can be used to add impurities in a semiconductor material to achieve desired conductivity, for example. Photolithography can be used to transfer patterns on a mask to a layer of material on a substrate, for example. Etching process can be performed after lithography to remove unwanted material layers, while planarization such as "etch-back" and chemical-mechanical polishing (CMP) can be employed to create a flat surface for the next processing step, for instance. Processing flows combining these and other necessary processing steps can be employed to form interposer structures in preferred embodiments. Starting from FIG. 7, various methods of forming an interposer in preferred embodiments will be described and emphasis is devoted to methods of forming a device selection unit 150 in order to form desired circuit functions in an interposer of preferred embodiments. As will be illustrated through the following examples, there are many ways of "programming" an interposer at many different stages. For example, desired devices in interposer arrays can be hard wired through a one-time, permanent connection before an interposer is formed. For another example, desired devices in interposer arrays can be connected after the interposer is completely formed. For further example, the "programming" can even take place after the entire electronic package is completed and mounted on a printed circuit board. For even further example, an interposer can be programmed and reprogrammed to supply different circuit functions meeting different integrated circuit die applications.

Figure 7A:
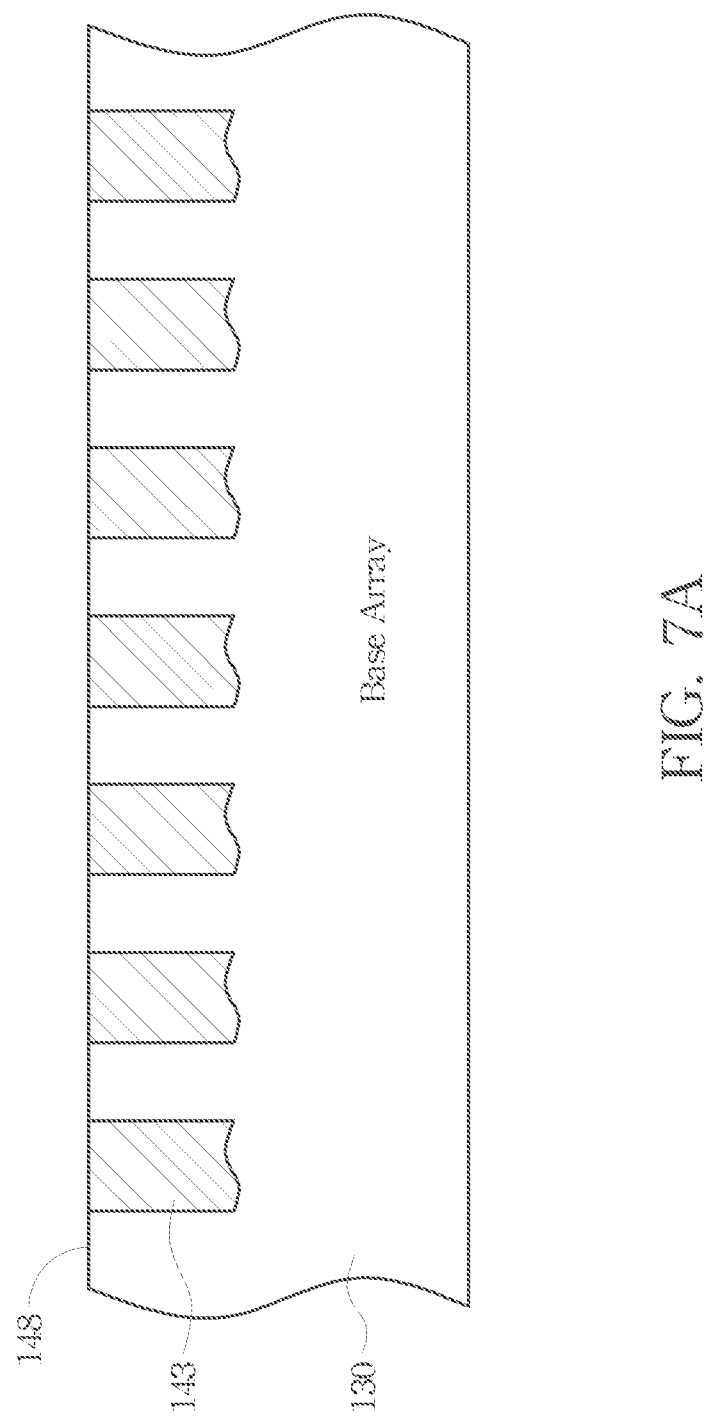
FIGS. 7A-7C shows one embodiment where a pre-formed base array interposer is "programmed" to provide custom circuit function.
Figure 7B:
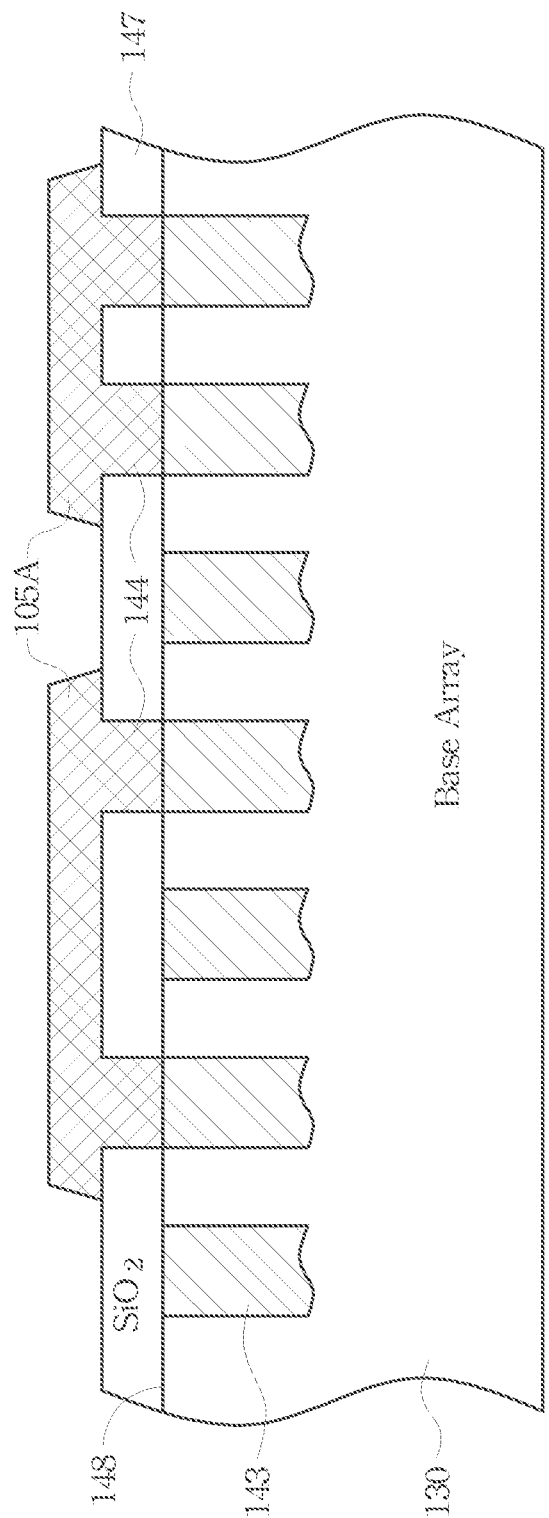
Figure 7C:
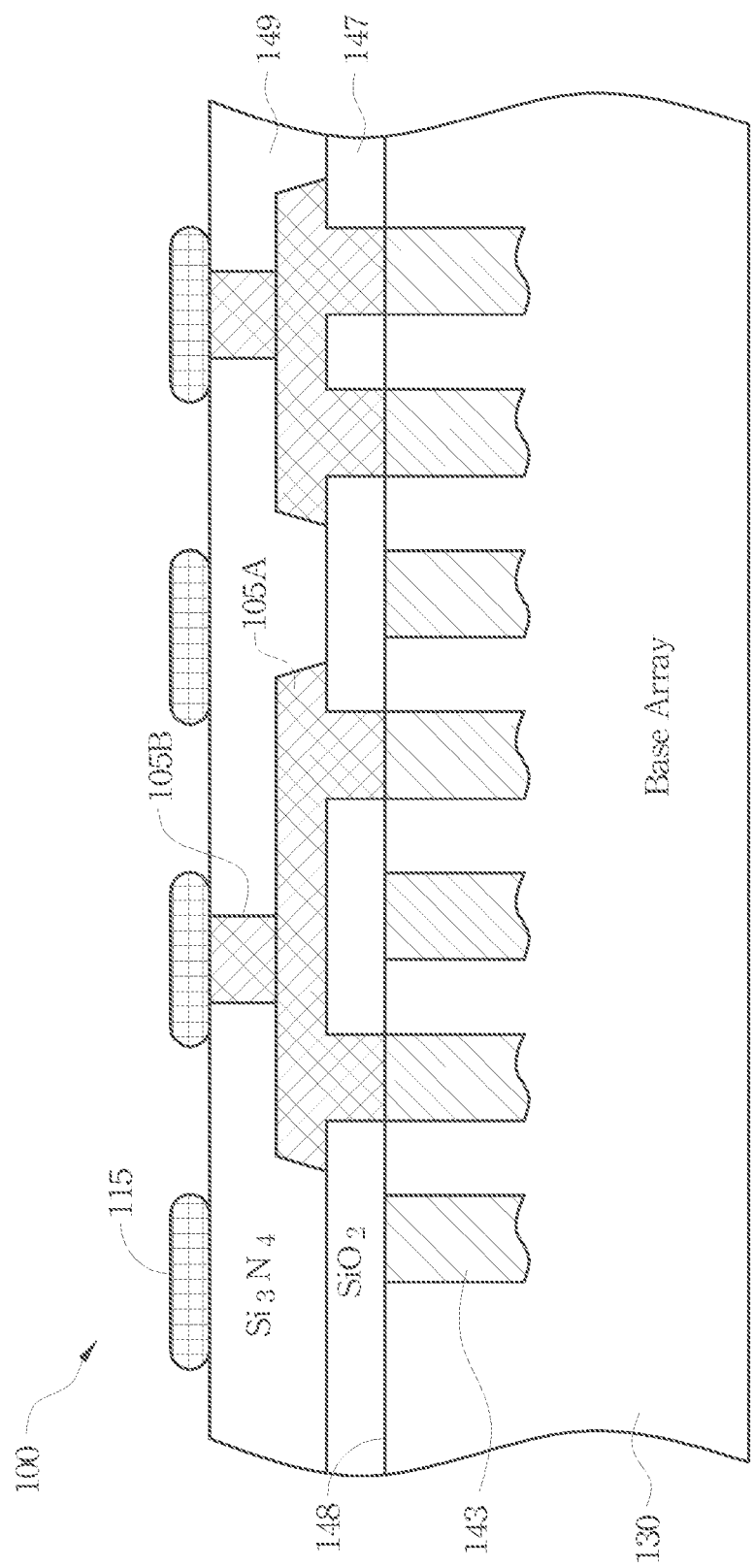

FIGS. 7A-7C illustrate one embodiment of forming a device selection unit 150 in interposer 100. Shown in FIG. 7A, active/passive device arrays (base arrays), such as those described in FIGS. 4-6 are pre-formed in an interposer substrate. Device terminals are electrically connected through interconnections 143 up to a substantially flat surface 148. Shown in FIG. 7B, an insulating layer 147, such as CVD $SiO_2$ is deposited on surface 148. A photolithography process using a custom photomask, is applied on layer 147 to pattern desired device connections, and a subsequent etch process, such as an RIE (reactive ion etching) plasma etch is employed to form custom via cuts 144. Then, a blank metal deposition process, such as Al or Cu CVD deposition is applied on the substrate surface and a second photolithography/etch process can be applied to pattern and form custom device connections 105A. Shown in FIG. 7C, a passivation layer 149 such as CVD $Si_3N_4$ is then deposited on substrate surface. A photolithography, etch, metal deposition process sequence can be employed to form connection 105B. A final solder bumping process is subsequently applied to form solder bumps 115 which are electrically connected to 105B. Upon finishing above processing steps, a custom electrical connection, such as those shown in FIGS. 3-6 is formed between selected devices terminal 143 solder bumps 115 and desired circuit functions can be coupled to an integrated circuit die (not shown) attached to the interposer 100.

In one embodiment, an integrated circuit die designer may choose from a layout library of predesigned and precharacterized interposers with only base arrays (base array interposers) and complete an interposer by designing custom masks for a top conductive layer or layers, which define the interconnections between devices. Since only the interconnections are unique to an interposer, a base array interposer can be used by many different circuit designers. Preferably, dedicated interposer designers may constantly develop and update base array interposer designs for a wide spectrum of integrated circuit applications. It can be appreciated that this method will greatly reduce cycle time needed to make an interposer and, in turn, an electronic package. The cost of initial interposer design and manufacturing may be shared by many integrated circuit projects. As can be appreciated by those skilled in the art, other techniques used in forming one-time, permanent custom connection in an integrated circuit such as laser trimming can also be employed to form preferred embodiments of silicon interposers.

Figure 8B:
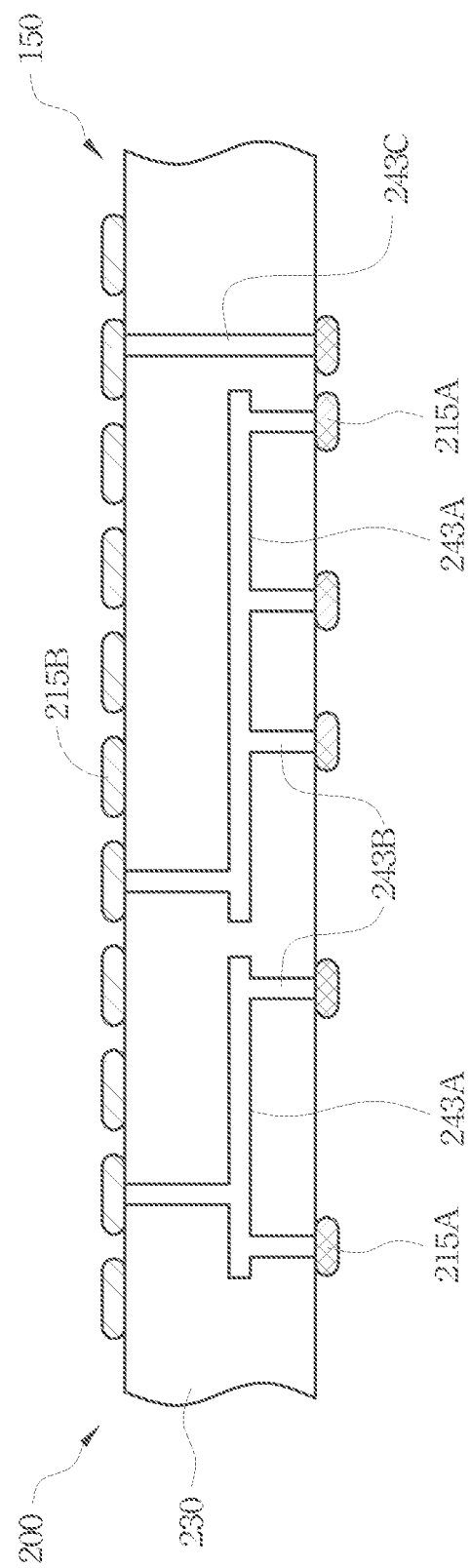
Figure 8C:
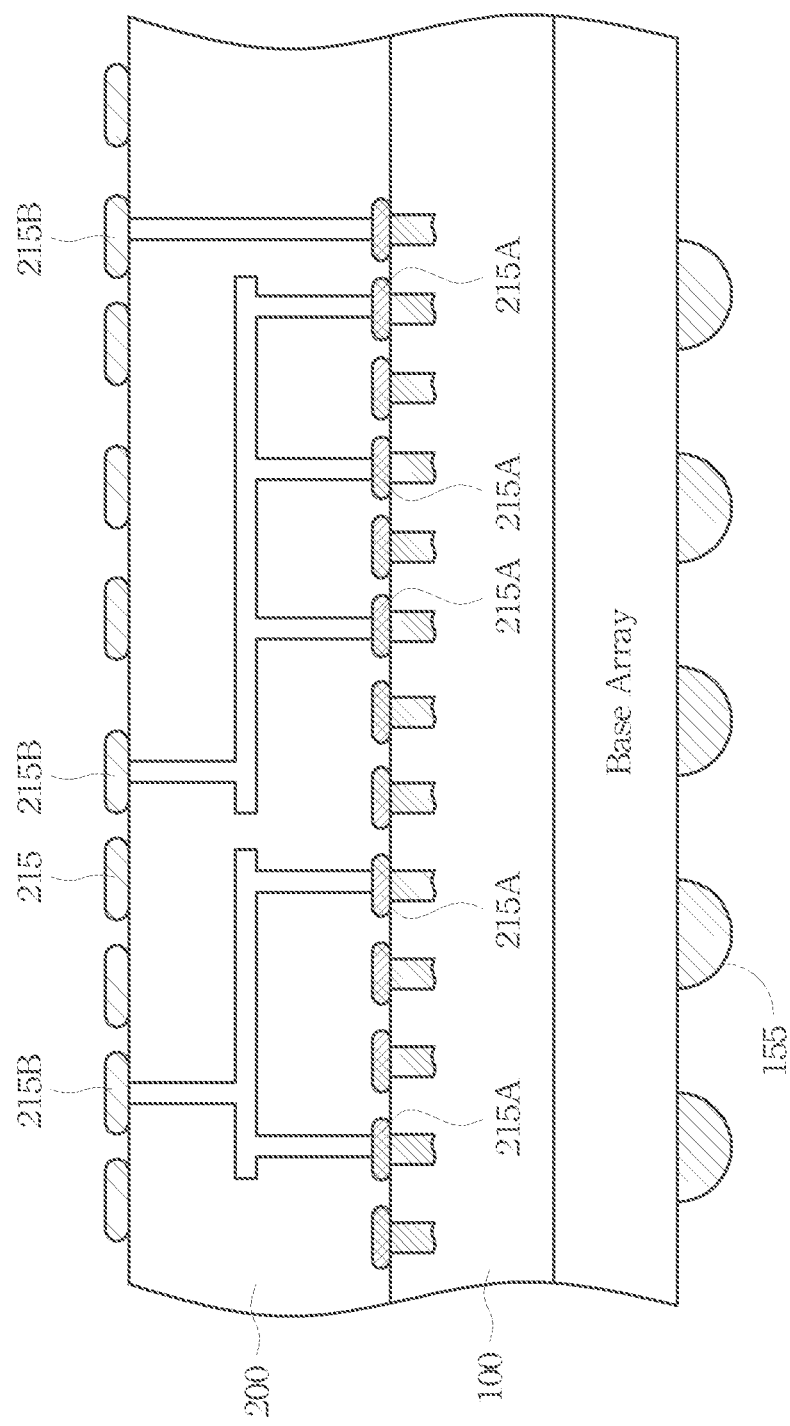

FIGS. 8A-8C shows another embodiment where "programming" a pre-made base array interposer takes place after a silicon interposer is completely formed. Shown in FIG. 8A, a base array silicon interposer 100 of a preferred embodiment is manufactured as a commercial off-the-shelf interposer, suitable for integrated circuit applications in a certain field, for example, interposers providing decoupling capacitors to high speed network circuit products. This interposer can be supplied to an integrated circuit designer (user) with proper specifications, such as interposer dimension, interposer material, coefficient of thermal expansion, solder bump geometries, solder bump pitch, solder ball pitch, suitable applications, available circuit functions, parameter ranges, etc. A user can "program" this off-the-shelf, base array interposer and provide desired circuit functions to a specific integrated circuit design by creating a custom adapter 200 such as that shown in FIG. 8B. In this embodiment, the custom adapter 200 acts as a device selection unit 150, illustrated in FIGS. 3-6, and is formed as a stand-alone structure. In FIG. 8B, a user-created adapter 200 includes a body 230 made of insulating materials having coefficient of thermal expansion close to that of integrated circuit die and Si interposer 100. In current embodiment, materials, such as glass epoxy printed plate, polyimide tape printed plate, and ceramic plate, are used for making adapter 200, although other materials are not excluded. A conductive sheet, preferably metal or metal alloy, such as Al and Cu, is impregnated in the insulating body 230. Metal traces 243A, are formed from said conductive sheet to make custom electrical connections between input terminals 215A (e.g., solder bumps, solder balls) formed on the bottom surface and output terminals 215B (e.g., solder bumps, solder balls) formed on the top surface of adapter 200, for example. Vias 243B are drilled and plated to make electrical connections to said metal traces 243A and selected terminals on the top and bottom surfaces of adapter 200, as shown in FIG. 8B. In forming metal traces 243A and vias 243B in FIG. 8B, two fiberglass plates plated with copper are individually drilled and the holes plated to form vias. The copper on the plate surfaces are then etched to leave copper only where interconnect traces are needed. A sheet of prepreg (uncured epoxy resin) is then interleaved with the fiberglass plates and laminated together. Afterward, another drilling step may be required to create through-adapter vias, such as 243C. Custom electrical adaptation between an integrated circuit die (not shown) and Si interposer 100 can be formed through solder bumps 215A and 215B on the bottom and top surfaces of adaptor 200, as shown in FIG. 8C. In a current embodiment, more than one layer of conductive sheets may be formed in adaptor 200 to facilitate more electrical connections or to provide dedicated power and ground layers to reduce electrical noise, for example. The steps used in forming adapter 200 is similar to those used in making a conventional multilevel printed circuit board and can be readily practiced by those skilled in the art.

The present embodiment does not require a circuit designer to get involved in an interposer design. A user can simply select a standard, pre-made base array interposer off a vendor catalog and "activate" it by creating a custom adaptor made by materials and steps used in forming a conventional printed circuit board, which are much more cost effective and widely available. Those of skill in the art will recognize that the present embodiment enables one type of Si interposer to be used for many different integrated circuit projects.

Figure 9A:
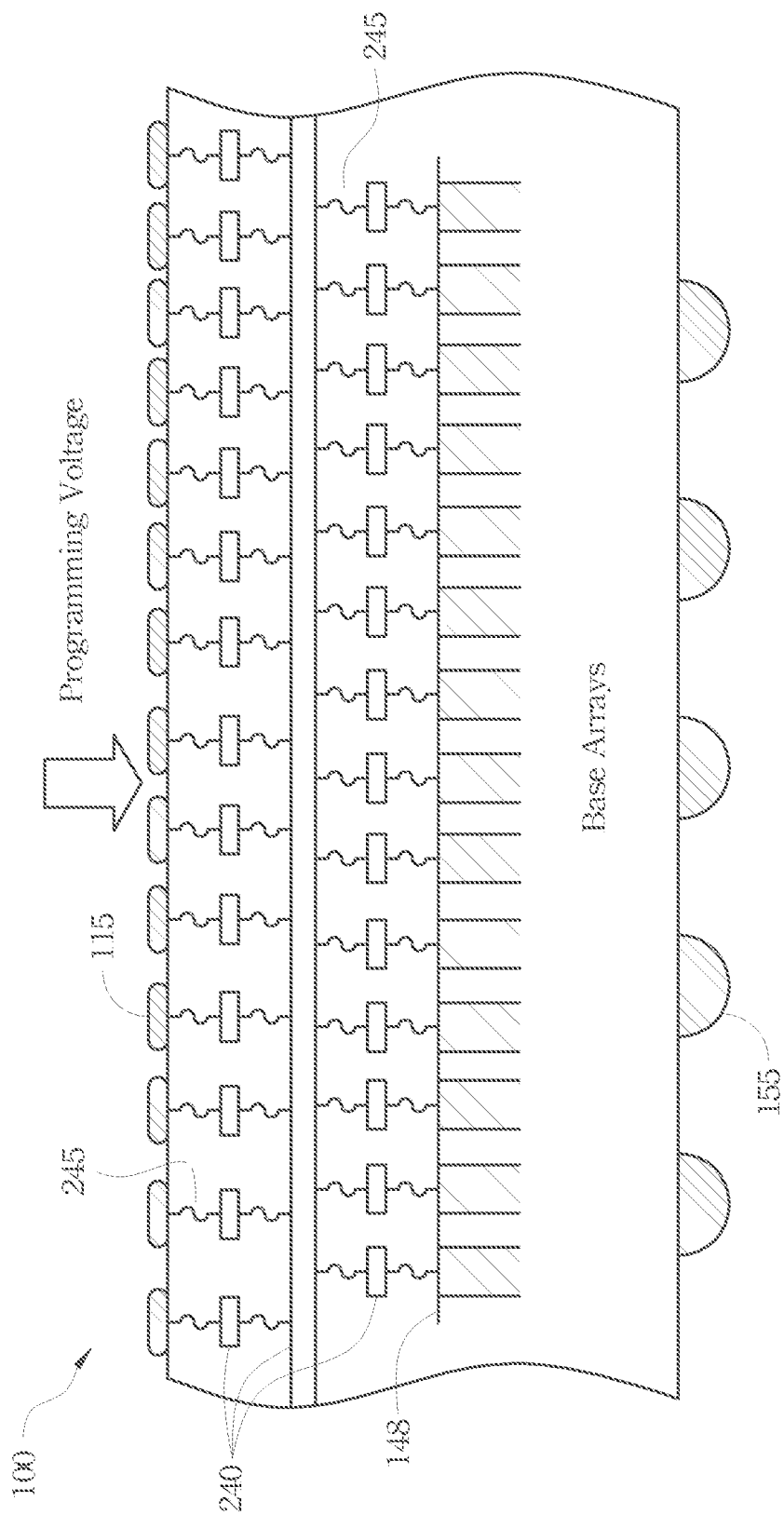
FIGS. 9A-9B illustrate yet another embodiment where "programming" a pre-made base array interposer is implemented by a special programming software.
Figure 9B:
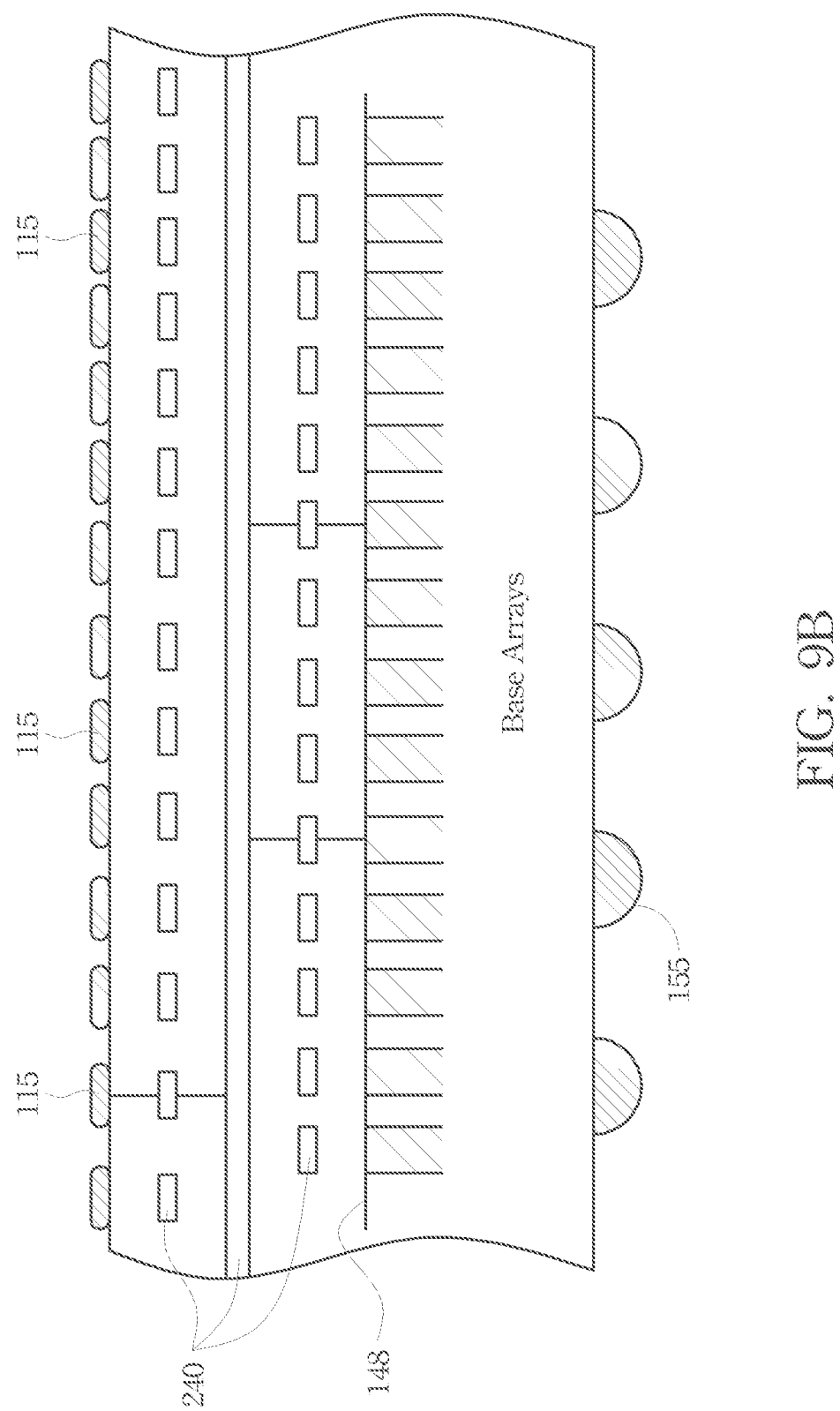

FIGS. 9A-9B illustrate yet another embodiment where "programming" a pre-made base array interposer is implemented by a special programming software. FIG. 9A is a schematic section view of an interposer of yet another preferred embodiment, where interconnect matrixes are formed in the top metal layers of a base array interposer 100. Successive routing channels 240 run vertically or horizontally as shown. At the intersection of routing traces is placed a one-time programmable antifuse 245. As familiar to those skilled in the art, an antifuse is a device that initially has a high resistivity (effectively an open circuit) and will become low resistance when a programming voltage is applied. When receiving an interposer of the current embodiment from an interposer developer/vendor, a user is provided with a programming board and programming software. In the preferred embodiment, a programming board includes an interposer socket and an interface to a computer, where said programming software is installed. Upon application of special programming signals (voltages) to an interposer, through solder bumps 115, attached to the socket of a programming board, the resistance at desired intersections can permanently drop to a few ohms (effectively a closed circuit). Custom connection to devices in an interposer of the current embodiment is permanently made upon the completion of the programming process as shown in FIG. 9B. In an interposer of another embodiment, a fuse is formed at the intersection of routing traces and a custom connection is formed when a special program directs high electrical current which blows unwanted fuses and forms permanent open circuits thereon.

Figure 10A:
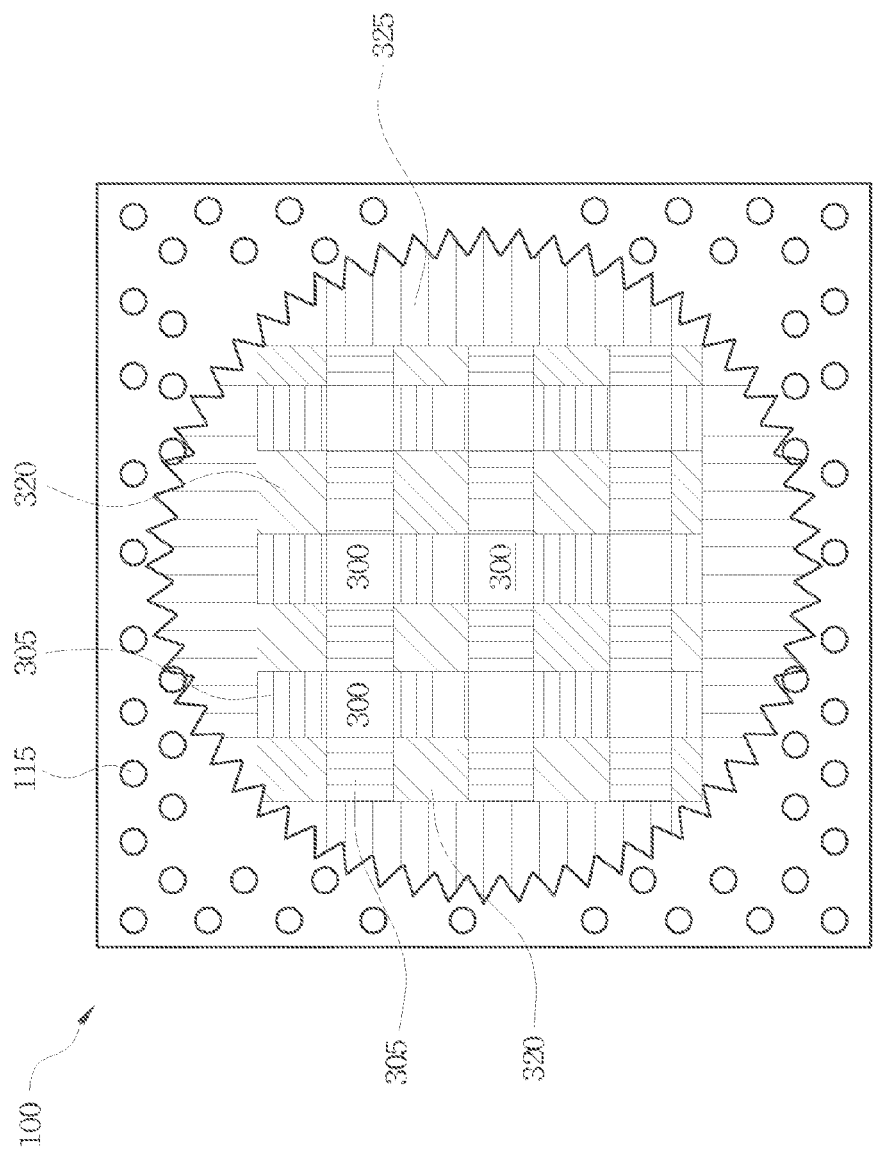
FIG. 10A shows a portion of an arrangement of devices formed inside an interposer of a preferred embodiment.
Figure 10B:
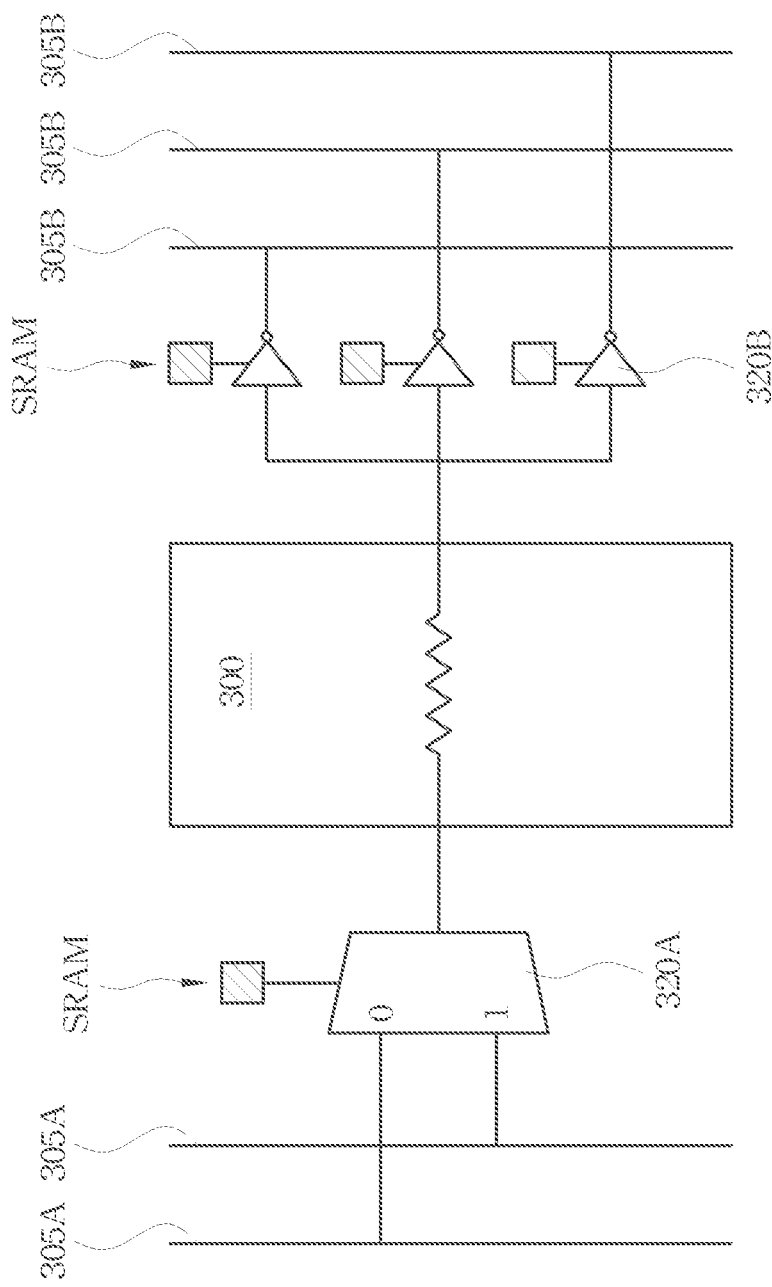
FIG. 10B illustrates a logical switch used in making custom device connection in regard to the embodiment shown in FIG. 10A.

In a further embodiment, an interposer can be programmed and reprogrammed to supply different circuit functions to meet different integrated circuit die applications. The "programming" can even take place after the entire electronic package is manufactured. FIG. 10A is a top view of an interposer of the current embodiment. Enclosed by a zigzagged circle in FIG. 10A is a portion of an underlying surface of an interposer 100 of preferred embodiments, where a preferred arrangement of passive devices is illustrated. It can be seen that arrays of active/passive devices 300 are formed in an interposer, similar to those shown in FIG. 3. Conductive routing tracks 305 run vertically and horizontally between the arrays of devices. These routing tracks terminate at routing switches 320 locating around each corner of a device, as shown. Routing switches 320 can selectively connect a device terminal to a routing track under instruction stored in e.g., an SRAM (Static Random Access Memory) (see FIG. 10B) formed in said interposer. Therefore, an interposer of the current embodiment can be programmed by reading an external instruction into the SRAM. I/O cells 325 may be formed around device arrays and can be used as input, output, or bidirectional signal paths to the device arrays. As an example shown in FIG. 10B, a two input multiplexer 320A in a routing switch 320 can selectively connect the input of a device 300, for instance a resistor as shown, to one of two conductive tracks 305A by control signal from an SRAM, while the output of device 300 can be driven to any of the three conductive tracks 305B by buffers 320B in a routing switch 320 controlled by an SRAM.

Figure 10C:
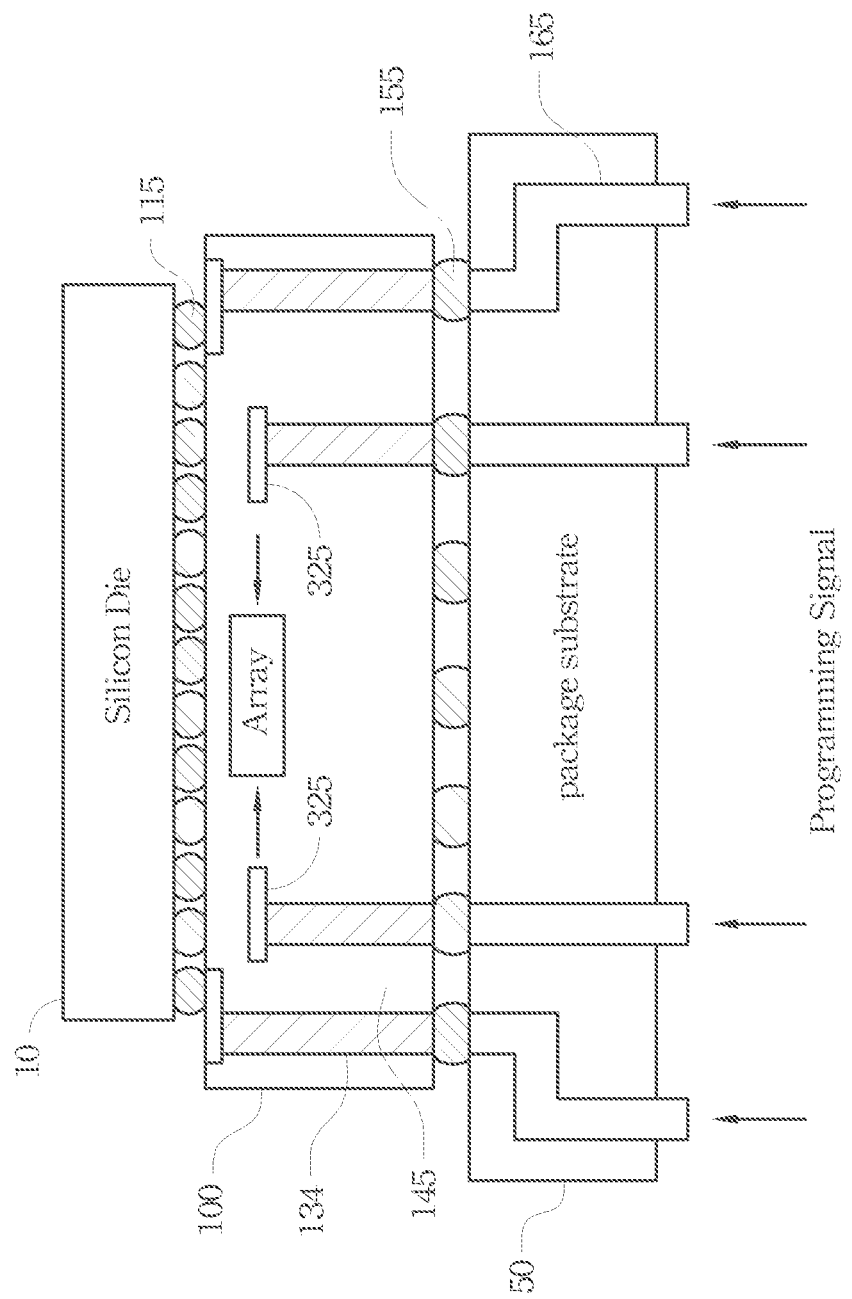
FIG. 10C is a section view of an electronic package embodying an interposer of a preferred embodiment, wherein circuit function can be programmed and reprogrammed.

Illustrated in FIG. 10C is a section view of an electronic package embodying the interposer 100 of another embodiment. After packaging, the top surface of interposer 100 is attached to a silicon-based integrated circuit die 10 through solder bump 115. Through-silicon-vias 134 in interposer 100 provide direct electrically conductive pathway between solder bumps 115 and solder balls 155 attached to the bottom side of interposer 100. Through-silicon-interconnections 145 connect to solder balls 155 and provide electrical connections to I/O cells 325 of a programmable array. The bottom side of interposer 100 is attached to package substrate 50 through solder balls 155, which in turn makes electrical connection to a printed circuit board (not shown) through package leads 165. In the preferred embodiment, said printed circuit board is a programming board connected to a computer, wherefrom a user can develop a custom program and send said program into the electronic package, as shown in FIG. 10C. Alternatively, said printed circuit board may be a product board with a built-in interposer programming circuit, where a desired circuit function can be formed in-situ in an interposer and coupled to an integrated circuit die. Under either scenario, a user can program and reprogram an interposer 100 of current embodiment until a desired product performance is achieved.

With the advent of standard, programmable interposers as described above, an integrated circuit designer or user (customer) is offered tremendous flexibility and cost advantage in forming electronic packages for an integrated circuit product. In preferred practice, at the development stage of an integrated circuit product, a circuit designer may develop an evaluation board where the more costly, "reprogrammable" package scheme is adopted, which combines a prototype integrated circuit die with a reprogrammable interposer, in order to decide what complementary circuit functions and device parameters should be expected from an interposer to achieve desired circuit performance. Beside circuit performance, such decision may also be influenced by other design, manufacturing and business related factors, such as price of final product, cost of interposer manufacturing, cost of packaging, turnaround time, etc. Designers must balance the interposer cost and performance in choosing the most suitable interposer for their final product.

When a desired interposer specification (such as circuit functions, devices parameters, interposer type) is obtained after the development stage, the integrated circuit product enters mass production phase. A customer can coordinate with an interposer vendor, a circuit die manufacturer (e.g. foundry) and an assembly site to produce packaged products in large scale. For example, after an integrated circuit is designed and prototype circuit die is evaluated at the system level on an evaluation board, an integrated circuit layout database is finalized and interposer parameters are decided upon. The circuit layout database is sent to a semiconductor manufacturing facility (FAB) for mass production. Wafers produced from a FAB are shipped to an assembly site for packaging. In selecting an interposer that provides, for instance, RF functions to said integrated circuit product, a customer may send an interposer specification to an independent interposer vendor and specify that "custom mask" is the scheme to be used for interposer manufacturing. The customer may then select, from a pre-developed, base array interposer library, a desired base array interposer layout database and design a custom mask/masks for device interconnections. The fully developed interposer layout database (with custom mask/masks) may be manufactured by the interposer vendor, for example, and finished interposers may be sent to said assembly site for packaging. At the assembly site, a customer may choose the proper packaging scheme matching the integrate circuit die and silicon interposer, to achieve desired circuit performance. The described customer-driven packaging flow is illustrated in FIG. 11.

Many different packaging configurations have been employed to couple circuit functions formed in a preferred embodiment programmable interposer to an integrated circuit die. Beside what is shown in FIG. 10C, where a single integrated circuit die is attached to a single programmable silicon interposer through solder bumps 115, the following are a few more alternative embodiments of a package serving to illustrate further features of significance. To avoid repetition, like numerals and letters are used for the alternative embodiments as were used in FIG. 12A. Also, elements described in FIG. 12A may not be described again in detail herein.

Figure 12A:
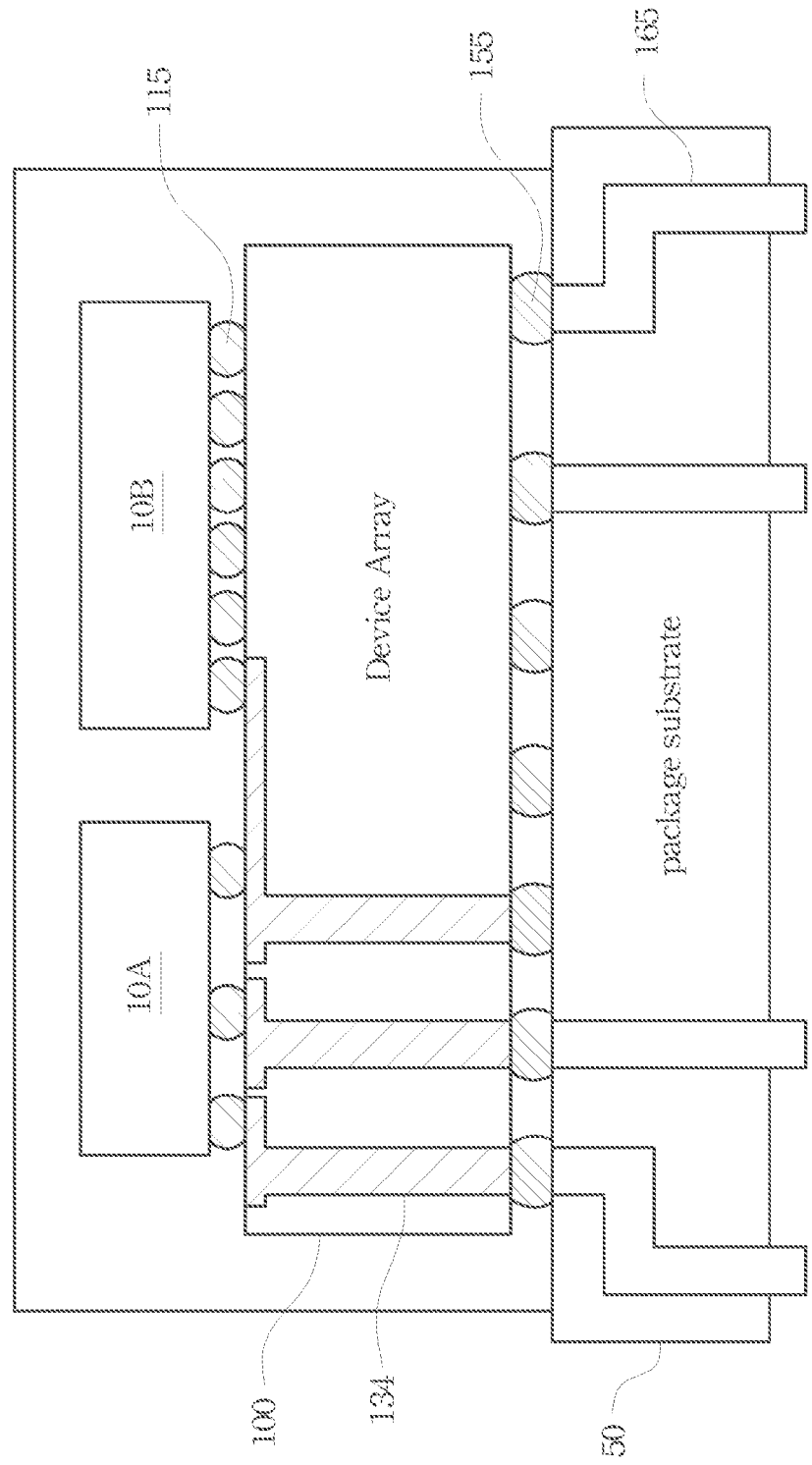
FIGS. 12A-12C show preferred embodiments of electronic package encapsulating silicon interposers of preferred embodiments of the current invention.

FIG. 12A shows an alternative embodiment of a package, which includes two integrated circuit dies 10A and 10B connected to a programmable interposer 100. This embodiment is employed when, for example, 10A and 10B are fabricated by different processing technologies to serve different circuit function. Through-silicon-vias 134 may be preferably formed in a first region in interposer 100 to facilitate fast access to integrated circuit die 10A, while device arrays may be preferably formed in a second region closer to an integrated circuit die 10B, wherein complementary circuit functions from an interposer are most needed.

Figure 12B:
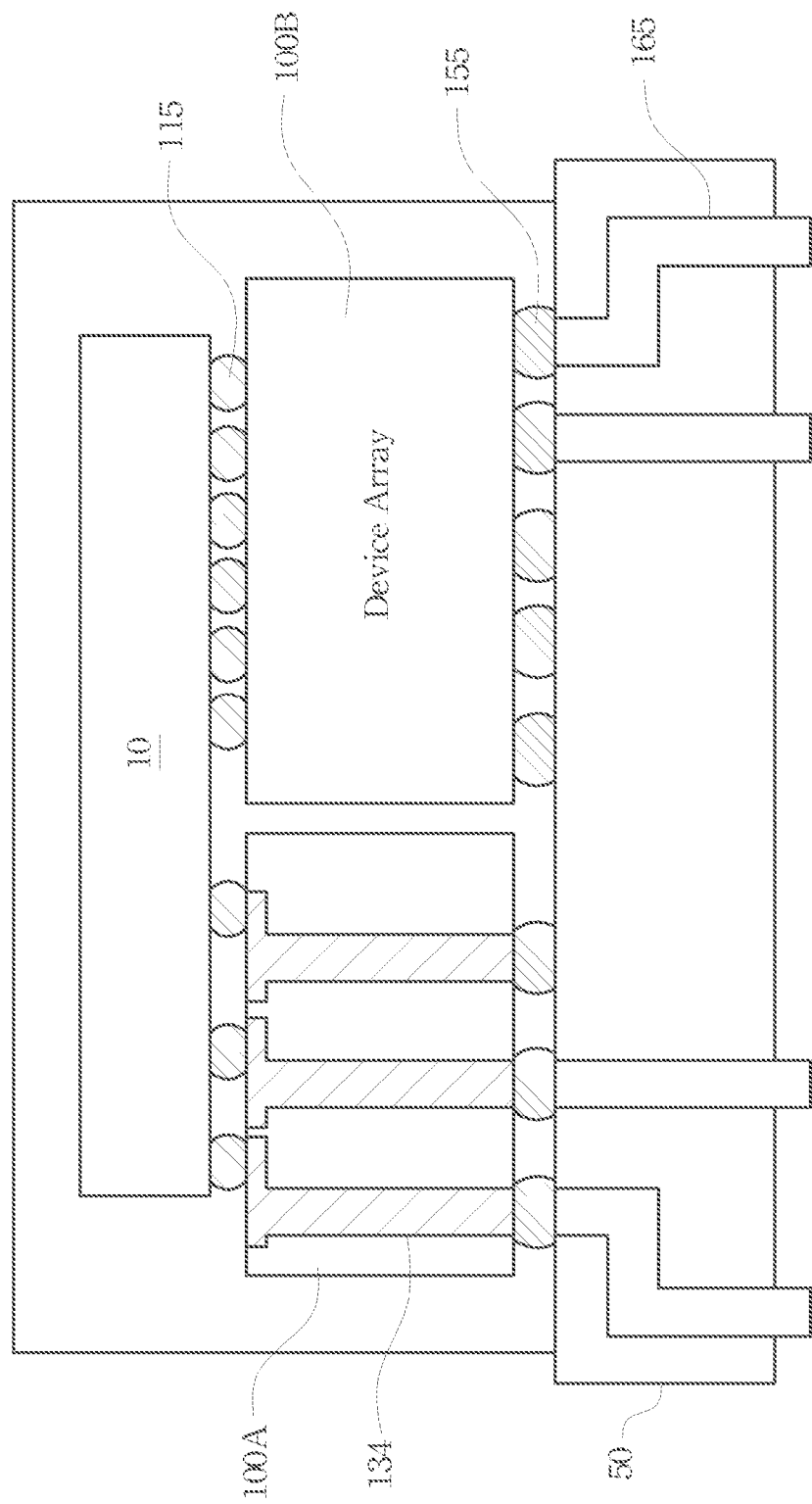

FIG. 12B shows another alternative embodiment of a package, which includes one integrated circuit die 10 connected to two silicon interposers 100A and 100B. This embodiment may be employed, for example, when more than one interposer is needed to provide necessary circuit functions to an integrated circuit die 10 and to provide electrical adaptation between integrated circuit die 10 and package substrate 50.

Figure 12C:
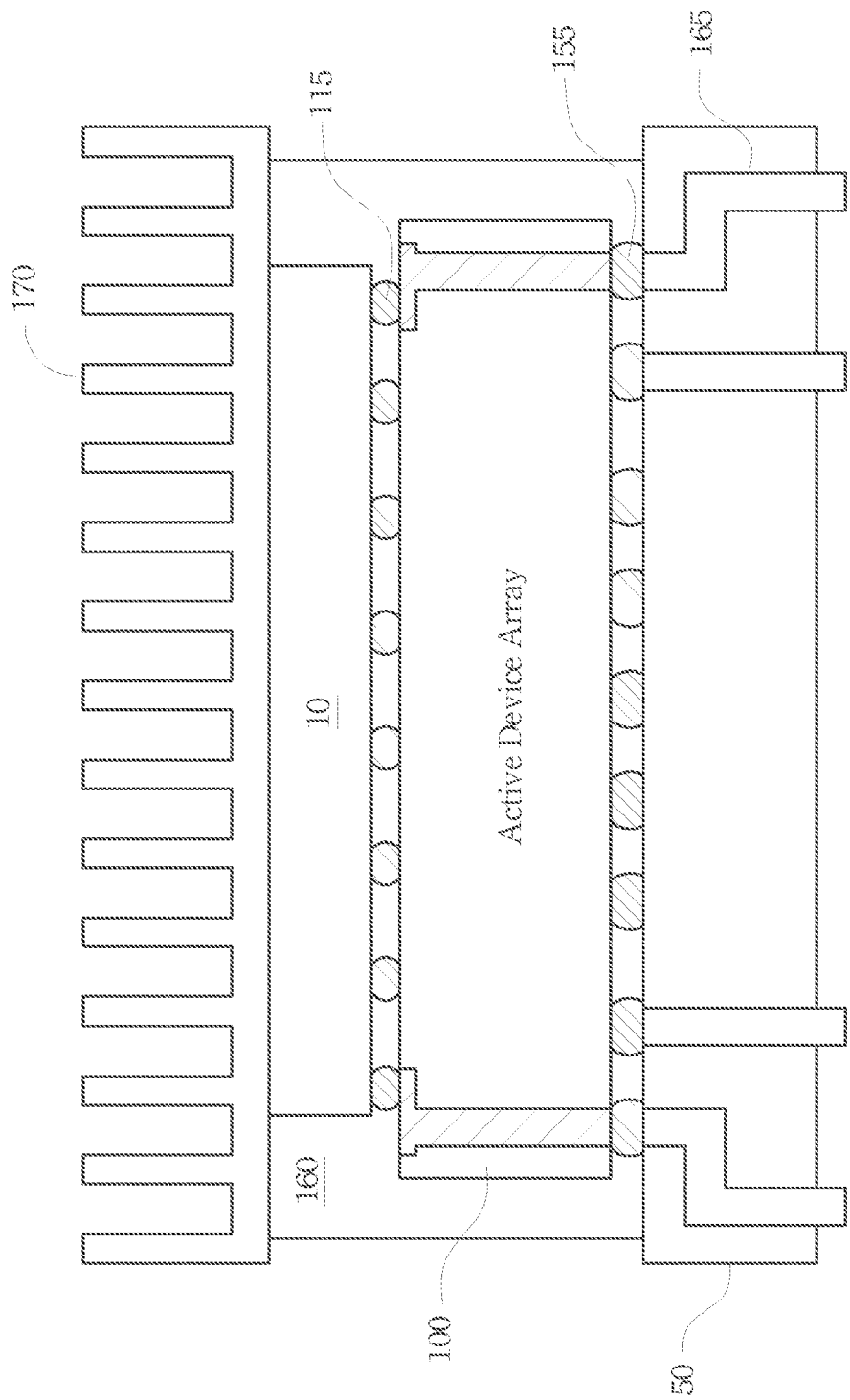

FIG. 12C shows yet another embodiment of packaging a programmable silicon interposer, where a silicon interposer 100 with active device arrays, such as thermal diode and MOS transistor arrays, is connected to an integrated circuit die 10 to provide, for example, temperature monitoring capability in the package. In this embodiment, thermally conductive materials 160, such as thermal grease G-751, X23-7762, X23-7783D, may be filled in the package to conduct heat generated by integrated circuit die 10 and silicon interposer 100 out of the package. Heat sink 170 made of heat conductive metal, for example, may also be used to cool the die by allowing the heat to rapidly diffuse over a much larger surface area.

In accordance with a preferred embodiment of the present invention, a semiconductor interposer comprises a substrate, an array of semiconductor devices having various electrical parameters formed in said substrate, one or more first conductive contact pads formed on a first surface of said substrate, one or more second conductive contact pads formed on a second surface of said substrate, one or more conductive paths passing through said substrate and connecting at least one of the first contact pads to at least one of the second contact pads, a device selection unit formed in said substrate, wherein said device selection unit selectively connects at least one of said devices to said first contact pads and forms a virtual element having a desired electrical parameter.

In accordance with another preferred embodiment of the present invention, a semiconductor interposer comprises a substrate, an array of passive semiconductor devices having various electrical parameters formed in said substrate, one or more first conductive contact pads formed on a first surface of said substrate, one or more second conductive contact pads formed on a second surface of said substrate, one or more conductive paths passing through said substrate and connecting at least one of the first contact pads to at least one of the second contact pads, wherein said devices can be selectively connected to each other to form a virtual element having a desired electrical parameter and be connected to said first contact pads.

In accordance with yet another preferred embodiment of the present invention, an electronic package comprises at least one semiconductor interposer which includes a substrate, one or more first conductive contact pads formed on a first surface of said substrate, one or more second conductive contact pads formed on a second surface of said substrate, one or more conductive paths passing through said substrate and connecting at least one of the first contact pads to at least one of the second contact pads, an array of passive semiconductor devices having various electrical parameters formed in said substrate, wherein said passive semiconductor devices can be selectively connected to each other and be connected to said first contact pads and form a virtual element having a desired electrical parameter, and at least one semiconductor integrated circuit die electrically coupled to said interposer.

An advantage of preferred embodiments of the present invention is that devices formed in an interposer embodiment of the current invention can be selectively connected by a device selection unit to form a custom circuit function, which, in turn, can be coupled to an integrated circuit die.

A further advantage of a preferred embodiment of the present invention is that the initial design and manufacturing cost of an interposer can be shared by many different customers, which would preferably reduce the cost and cycle time of an integrated circuit product.

Although the present invention and its advantages have been described in detail, it should be understood that various changes, substitutions and alterations can be made herein without departing from the spirit and scope of the invention as defined by the appended claims. For example, a plurality of integrated circuit dies and a plurality of silicon interposers of preferred embodiments may be formed in a package. As another example, the package of preferred embodiments may include an epoxy underfill material between the integrated circuit die and interposer, and between interposer and package substrate to provide more reliable electrical connection and protect the solder bumps connecting integrated circuit die, silicon interposer and package substrate from external contaminations, as appreciated by those skilled in the art. For a further example, a programmable interposer of preferred embodiments can be formed by other semiconductor materials (such as silicon germanium, gallium arsenide, indium phosphide) or non-semiconductor materials (such as resin, ceramic, polymide), which may provide a matching coefficient of thermal expansion to an integrated circuit die.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor interposer, the method comprising:
   forming an array of semiconductor devices having a plurality of electrical parameters in an insulating material on a first surface of a substrate, each semiconductor device of the array of semiconductor devices having a vertical interconnect extending to a first surface of the insulating material;
   forming one or more first contact pads on a second surface of the substrate, the second surface of the substrate being a second surface of the semiconductor interposer;
   forming one or more second contact pads over the insulating material, the one or more second contact pads being on a first surface of the semiconductor interposer, the first surface of the interposer being opposite the second surface of the interposer, the first surface of the insulating material being between the first surface of the substrate and the first surface of the semiconductor interposer, at least one of the second contact pads being coupled to at least one of the first contact pads; and
   obtaining a desired electrical parameter for an integrated circuit device attached to the interposer comprising:
      selectively connecting the vertical interconnect of at least one of the array of semiconductor devices to at least one of the second contact pads; and
      selectively connecting the vertical interconnect of at least one of the array of semiconductor devices to the vertical interconnect of at least one other of the array of semiconductor devices.

2. The method of claim 1, wherein obtaining the desired electrical parameter for an integrated circuit device attached to the interposer comprises serially connecting at least two of the array of semiconductor devices.

3. The method of claim 1, wherein obtaining the desired electrical parameter for an integrated circuit device attached to the interposer comprises a parallel connection between at least two of the array of semiconductor devices.

4. The method of claim 1, wherein the array of semiconductor devices comprises semiconductor devices being arranged in at least two layers with at least one of the semiconductor devices overlying at least one other of the semiconductor devices.

5. The method of claim 1, wherein obtaining the desired electrical parameter for an integrated circuit device attached to the interposer further comprises:
   forming an interconnect matrix having at least two conductive layers in another insulating material;
   forming a plurality of one-time programmable fuses or antifuses, each of the plurality of fuses or antifuses being at each intersection of the at least two conductive layers; and
   applying a programming voltage to at least two of the plurality of the one-time programmable fuses or antifuses to selectively couple portions of the at least two conductive layers.

6. The method of claim 1, wherein obtaining the desired electrical parameter for an integrated circuit device attached to the interposer further comprises:
   forming routing tracks between the array of semiconductor devices;
   forming routing switches adjacent the array of semiconductor devices, each of the routing tracks terminating at a routing switch; and
   programming the routing switches to selectively connect at least one of the array of semiconductor devices to a routing track.

7. The method of claim 1, wherein the array of semiconductor devices comprises a resistor, a capacitor, an inductor, a transmission line, a fuse, an antifuse, or a microelectromechanical systems device.

8. The method of claim 1 further comprising forming one or more conductive paths through the interposer, the one or more conductive paths coupling at least one of the first contact pads to at least one of the second contact pads.

9. The method of claim 1, wherein the selective connections of the vertical interconnects the array of semiconductor devices are being made between the first surface of the semiconductor interposer and the first surface of the insulating material.

10. A method of forming a semiconductor interposer, the method comprising:
   forming an array of semiconductor devices having a plurality of electrical parameters in an insulating material on a first surface of a substrate, each semiconductor device of the array of semiconductor devices having a vertical interconnect extending to a first surface of the insulating material;
   forming one or more first contact pads on a second surface of the substrate;
   forming a device selection unit on the insulating material; and forming one or more second contact pads over the device selection unit, wherein the device selection unit is capable of:
    selectively connecting the vertical interconnect of at least one of the array of semiconductor devices to at least one of the second contact pads; and
    selectively connecting the vertical interconnect of at least one of the array of semiconductor devices to the vertical interconnect of at least one other of the array of semiconductor devices.

11. The method of claim 10, wherein forming the device selection unit comprises:
    forming an interconnect matrix having at least two conductive layers in another insulating material;
    forming a plurality of one-time programmable fuses or antifuses, each of the plurality of fuses or antifuses being at each intersection of the at least two conductive layers; and
    applying a programming voltage to at least two of the plurality of the one-time programmable fuses or antifuses to selectively couple portions of the at least two conductive layers.

12. The method of claim 10, wherein all of the semiconductor devices in the array of semiconductor devices are a same type of device.

13. The method of claim 10 further comprising forming one or more active devices in the first surface of the substrate, at least one of the one or more active devices being coupled to at least one of the second contact pads.

14. The method of claim 10, wherein the device selection unit selectively connects at least two of the array of semiconductor devices to form a combined device, the combined device having a desired electrical parameter.

15. The method of claim 10 further comprising forming one or more conductive paths passing through the substrate and connecting at least one of the first contact pads to at least one of the second contact pads.

16. The method of claim 10, wherein forming the device selection unit comprises forming one or more custom conductive layers on the insulating material.

17. A method of forming an electronic package, the method comprising:
    forming a programmable semiconductor interposer comprising:
        forming an array of semiconductor devices having a plurality of electrical parameters in an insulating material on a substrate; and
        forming a device selection unit on the insulating material;
        forming a plurality of first contact pads on a first surface of the programmable semiconductor interposer;
        forming a plurality of second contact pads on a second surface of the programmable semiconductor interposer, the second surface being opposite the first surface, the device selection unit being between the first and second surfaces of the programmable semiconductor interposer;
    programming the programmable semiconductor interposer by the device selection unit, the programming comprising:
        connecting at least two of the array of semiconductor devices to form a custom device; and
        connecting at least one of the array of semiconductor devices to at least one of the plurality of first contact pads; and
    bonding an integrated circuit die to the first contact pads, the custom device having a desired electrical parameter for the integrated circuit die.

18. The method of claim 17, wherein forming the programmable semiconductor interposer further comprises:
    selecting a semiconductor interposer design from an interposer design database; and
    designing the device selection unit based on the selected semiconductor interposer design.

19. The method of claim 17, wherein each of the array of semiconductor devices have an interconnect extending to the device selection unit, each of the interconnects being perpendicular to a top surface of the insulating material.

20. The method of the claim 17, wherein connecting the at least two of the array of semiconductor devices to form a custom device comprises serially connecting the at least two of the array of semiconductor devices.

21. The method of the claim 17, wherein programming the programmable semiconductor interposer by the device selection unit further comprises:
    forming routing tracks between the array of semiconductor devices;
    forming routing switches adjacent the array of semiconductor devices, each of the routing tracks terminating at a routing switch; and
    programming the routing switches to selectively connect at least one of the array of semiconductor devices to a routing track, the routing switches capable of being reprogrammed to selectively connect at least one other of the array of semiconductor devices to the routing track.

* * * * *